(12) United States Patent
Okajima

(10) Patent No.: US 12,464,706 B2
(45) Date of Patent: Nov. 4, 2025

(54) SEMICONDUCTOR MEMORY DEVICE

(71) Applicant: Kioxia Corporation, Tokyo (JP)

(72) Inventor: Mutsumi Okajima, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 426 days.

(21) Appl. No.: 18/179,537

(22) Filed: Mar. 7, 2023

(65) Prior Publication Data

US 2023/0413519 A1    Dec. 21, 2023

(30) Foreign Application Priority Data

Jun. 21, 2022    (JP) ................... 2022-099893

(51) Int. Cl.
*H10B 12/00* (2023.01)
*G11C 5/10* (2006.01)

(52) U.S. Cl.
CPC ............. *H10B 12/312* (2023.02); *G11C 5/10* (2013.01)

(58) Field of Classification Search
CPC ..................... H10B 12/036; H10B 12/312
See application file for complete search history.

(56) References Cited

U.S. PATENT DOCUMENTS

| 8,519,387 | B2 | 8/2013 | Endo et al. |
| 8,828,794 | B2 | 9/2014 | Yamazaki et al. |
| 9,349,869 | B2 | 5/2016 | Koezuka et al. |
| 2010/0133525 | A1 | 6/2010 | Arai et al. |
| 2013/0288426 | A1 | 10/2013 | Akimoto |
| 2017/0141130 | A1 | 5/2017 | Yamazaki |
| 2018/0166320 | A1* | 6/2018 | Kim ........................ H10D 1/716 |
| 2018/0190804 | A1* | 7/2018 | Chui ....................... H10D 64/311 |
| 2019/0067336 | A1* | 2/2019 | Yamazaki ............. H10D 86/451 |
| 2020/0266289 | A1 | 8/2020 | Yamazaki et al. |
| 2021/0225847 | A1 | 7/2021 | Wada et al. |
| 2021/0249540 | A1 | 8/2021 | Hattori et al. |
| 2021/0280700 | A1* | 9/2021 | Wernersson ........... H10D 30/43 |
| 2021/0384326 | A1 | 12/2021 | Yamazaki et al. |
| 2022/0005809 | A1* | 1/2022 | Kim ...................... H10D 86/423 |
| 2022/0068859 | A1* | 3/2022 | Choi ...................... H10B 12/05 |
| 2022/0310612 | A1 | 9/2022 | Okajima |
| 2023/0247840 | A1* | 8/2023 | Im ......................... H10D 30/701 257/295 |

FOREIGN PATENT DOCUMENTS

| CN | 114121816 A | * | 3/2022 | ............ H10B 12/03 |
| JP | 5515281 B2 | | 6/2014 | |
| JP | 6116331 B2 | | 4/2017 | |
| JP | 2021-170651 A | | 10/2021 | |
| JP | 2022-147872 A | | 10/2022 | |
| WO | WO-2019/048984 A1 | | 3/2019 | |
| WO | WO-2020/084415 A1 | | 4/2020 | |

* cited by examiner

*Primary Examiner* — Edward Chin
(74) *Attorney, Agent, or Firm* — Foley & Lardner LLP

(57) ABSTRACT

A semiconductor memory device includes: a memory cell array including memory cells, each including an oxide semiconductor transistor; a first insulating layer disposed above the memory cell array; a first wiring layer disposed between the memory cell array and the first insulating layer; a second insulating layer extending in a vertical direction. The second insulating layer has an annular cross-section. The semiconductor memory device includes a third insulating layer further disposed over the first insulating layer, a portion of the third insulating layer being surrounded by the second insulating layer.

18 Claims, 20 Drawing Sheets

SEMICONDUCTOR MEMORY DEVICE

CROSS-REFERENCE TO RELATED APPLICATION

This application is based upon and claims the benefit of priority from Japanese Patent Application No. 2022-099893, filed Jun. 21, 2022, the entire contents of which are incorporated herein by reference.

FIELD

Embodiments described herein relate generally to a semiconductor memory device.

BACKGROUND

An oxide semiconductor transistor that forms a channel in an oxide semiconductor layer has an excellent characteristic that a channel leakage current during an OFF operation is extremely low. Therefore, for example, the oxide semiconductor transistor is applicable to a switching transistor of a memory cell of a dynamic random access memory (DRAM).

DETAILED DESCRIPTION

Figure 1:
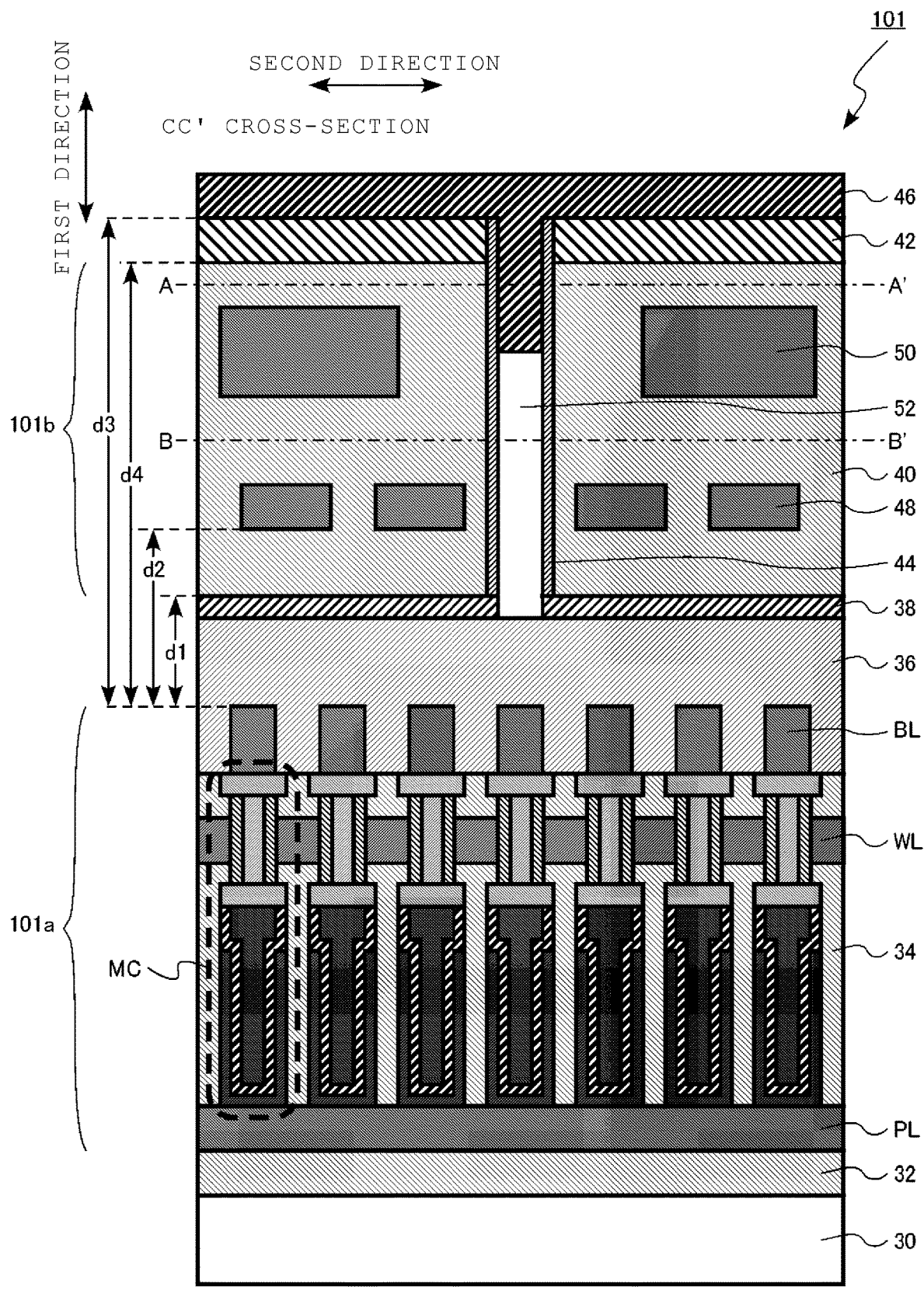
FIG. 1 is a schematic cross-sectional view illustrating a semiconductor memory device according to a first embodiment.

Embodiments provide a semiconductor memory device having excellent characteristics.

In general, according to one embodiment, a semiconductor memory device includes: a memory cell array including a plurality of memory cells, each of the memory cells including at least an oxide semiconductor transistor;
a first insulating layer disposed above the memory cell array;
a first wiring layer disposed between the memory cell array and the first insulating layer; a second insulating layer extending in a first direction from the memory cell array toward the first insulating layer. A first distance in the first direction from a lower end of the second insulating layer to the memory cell array is less than a second distance in the first direction from the first wiring layer to the memory cell array. A third distance in the first direction from an upper end of the second insulating layer to the memory cell array is greater than a fourth distance in the first direction from the first insulating layer to the memory cell array. The second insulating layer has an annular cross-section. The semiconductor memory device includes a third insulating layer further disposed over the first insulating layer, a portion of the third insulating layer being surrounded by the second insulating layer.

Hereinafter, embodiments of the present disclosure will be described with reference to the drawings. In the following description, the same or similar members or the like will be represented by the same or similar reference numerals, and description of members or the like described once will not be made appropriately in some cases.

In addition, for convenience of description, the term "up", "down", "upper", or "lower" may be used in the present specification. the term "up", "down", "upper", or "lower" merely represents a relative positional relationship in the drawing and does not define a positional relationship with respect to the gravity.

Qualitative analysis and quantitative analysis of chemical compositions of members forming a semiconductor memory device in the present specification can be performed, for example, by secondary ion mass spectrometry (SIMS), energy dispersive X-ray spectroscopy (EDX), or Rutherford backscattering spectroscopy (RBS). In addition, in order to measure the thicknesses of the members forming the semiconductor memory device, the distance between the members, the crystal grain size, and the like, for example, a transmission electron microscope (TEM) may be used.

First Embodiment

A semiconductor memory device according to a first embodiment includes: a memory cell array where a plurality of memory cells including an oxide semiconductor transistor are located; a first insulating layer; a first wiring layer provided between the memory cell array and the first insulating layer; a second insulating layer extending in a first direction from the memory cell array toward the first insulating layer, in which a first distance in the first direction from a first end to the memory cell array is less than a second distance in the first direction from the first wiring layer to the memory cell array, a third distance in the first direction from a second end to the memory cell array is greater than a fourth distance in the first direction from the first insulating layer to the memory cell array, and the second insulating layer has an annular shape in a first cross-section perpendicular to the first direction; and a third insulating layer provided such that the first insulating layer and the second insulating layer are provided between the third insulating layer and the memory cell array, a part of the third insulating layer being surrounded by the second insulating layer in the first cross-section.

Figure 2:
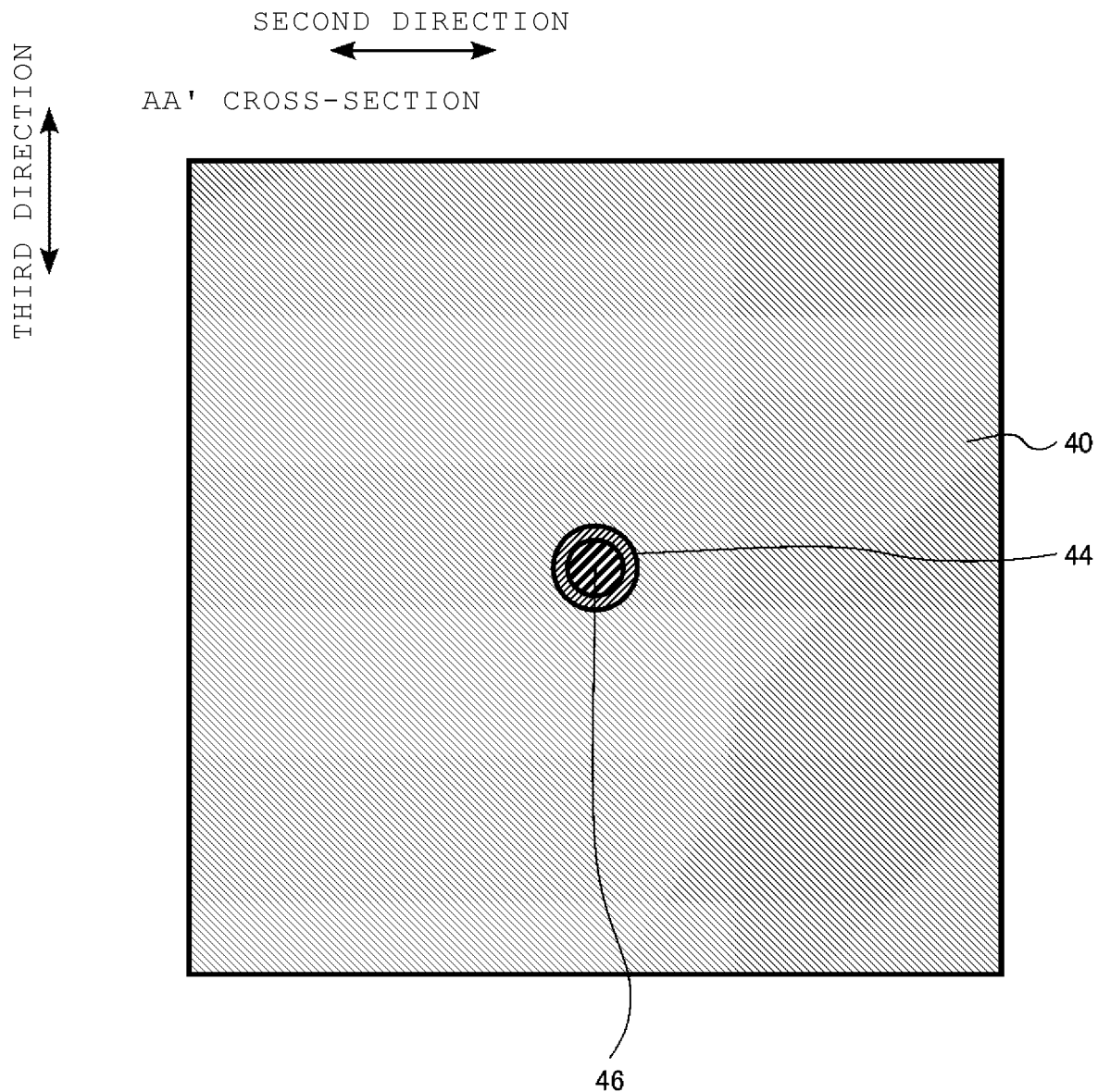
FIG. 2 is a schematic cross-sectional view illustrating the semiconductor memory device according to the first embodiment.
Figure 3:
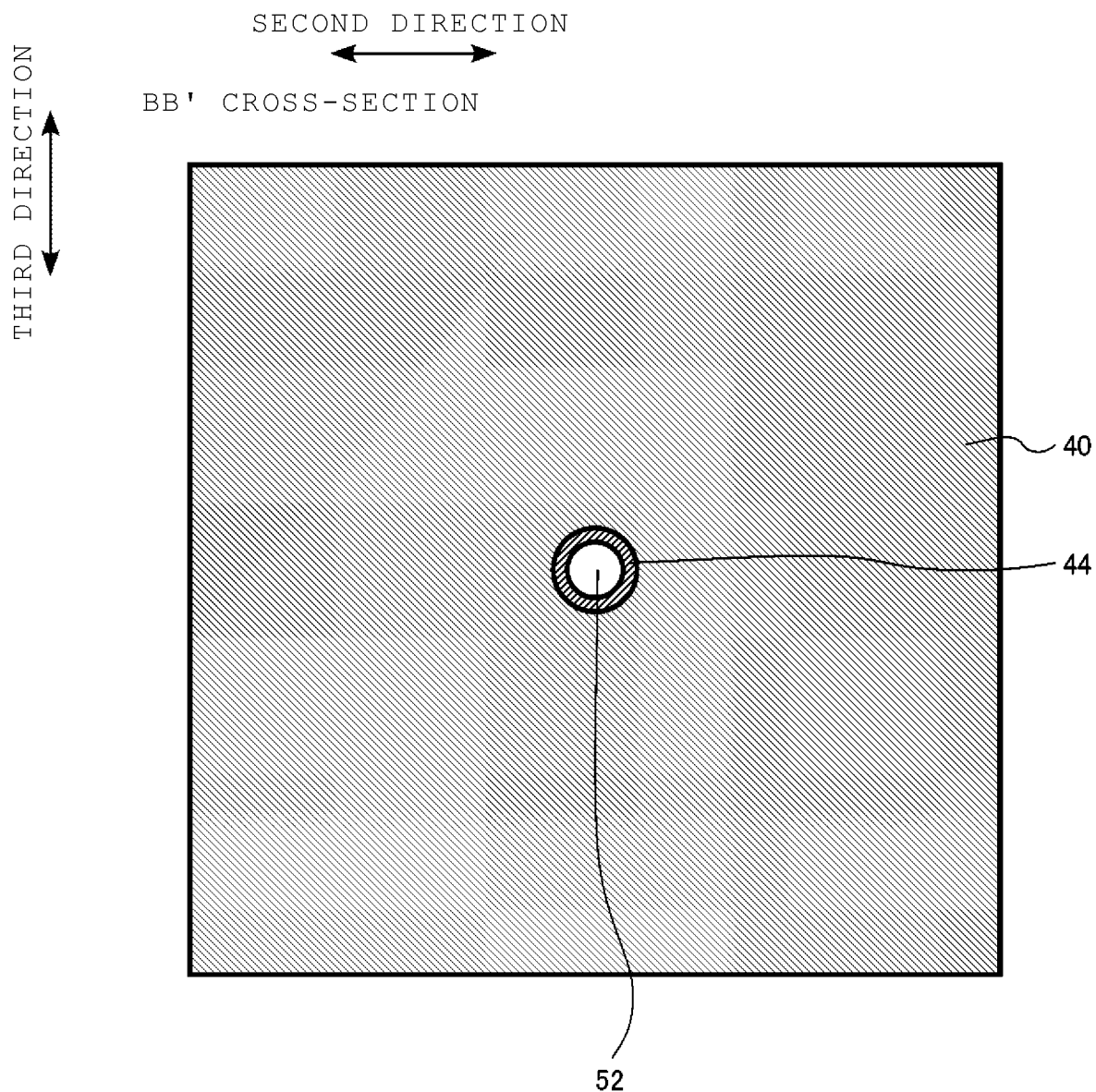
FIG. 3 is a schematic cross-sectional view illustrating the semiconductor memory device according to the first embodiment.
Figure 4:
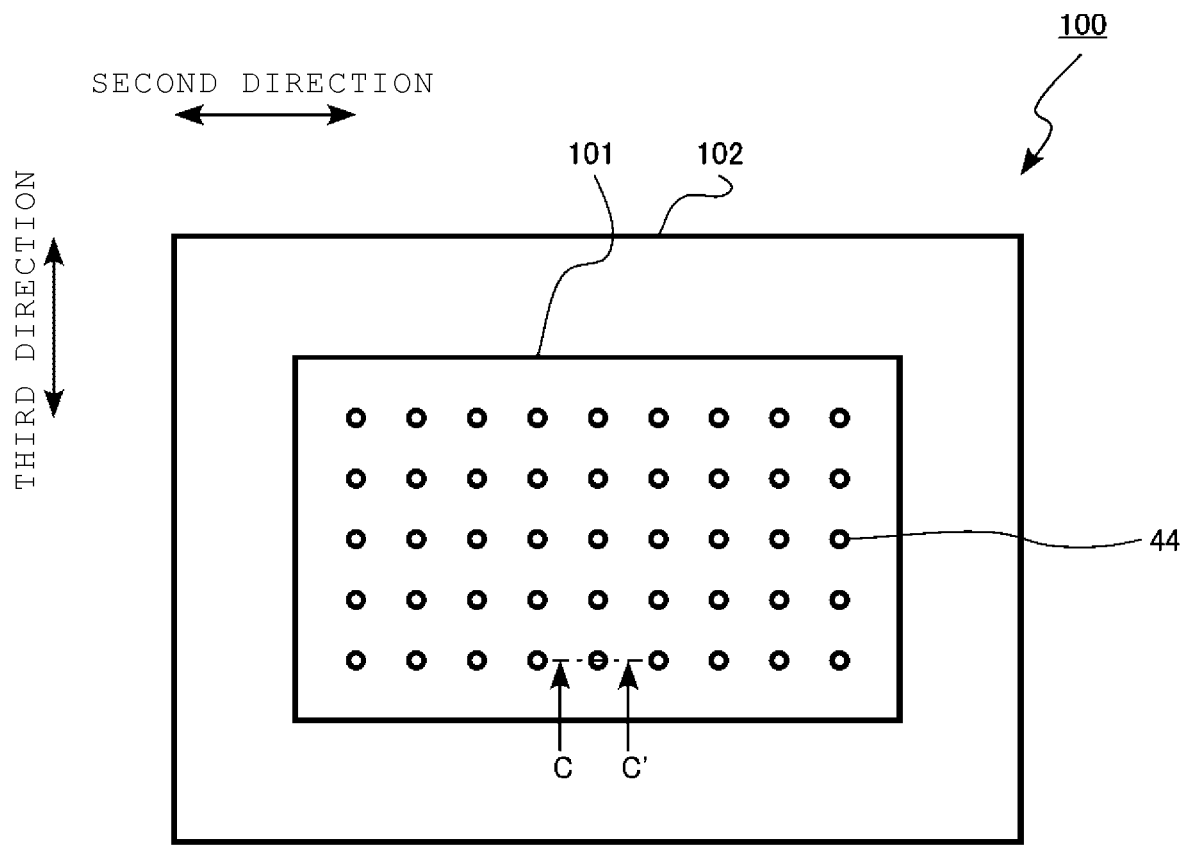
FIG. 4 is a layout diagram illustrating the semiconductor memory device according to the first embodiment.

FIGS. 1, 2, and 3 are schematic cross-sectional views illustrating the semiconductor memory device according to the first embodiment. FIG. 4 is a layout diagram illustrating the semiconductor memory device according to the first embodiment. FIG. 1 illustrates a CC' cross-section of FIG. 4. FIG. 2 is an AA' cross-sectional view of FIG. 1. FIG. 3 is a BB' cross-sectional view of FIG. 1. FIG. 4 illustrates an arrangement pattern of a second barrier insulating layer.

Figure 5:
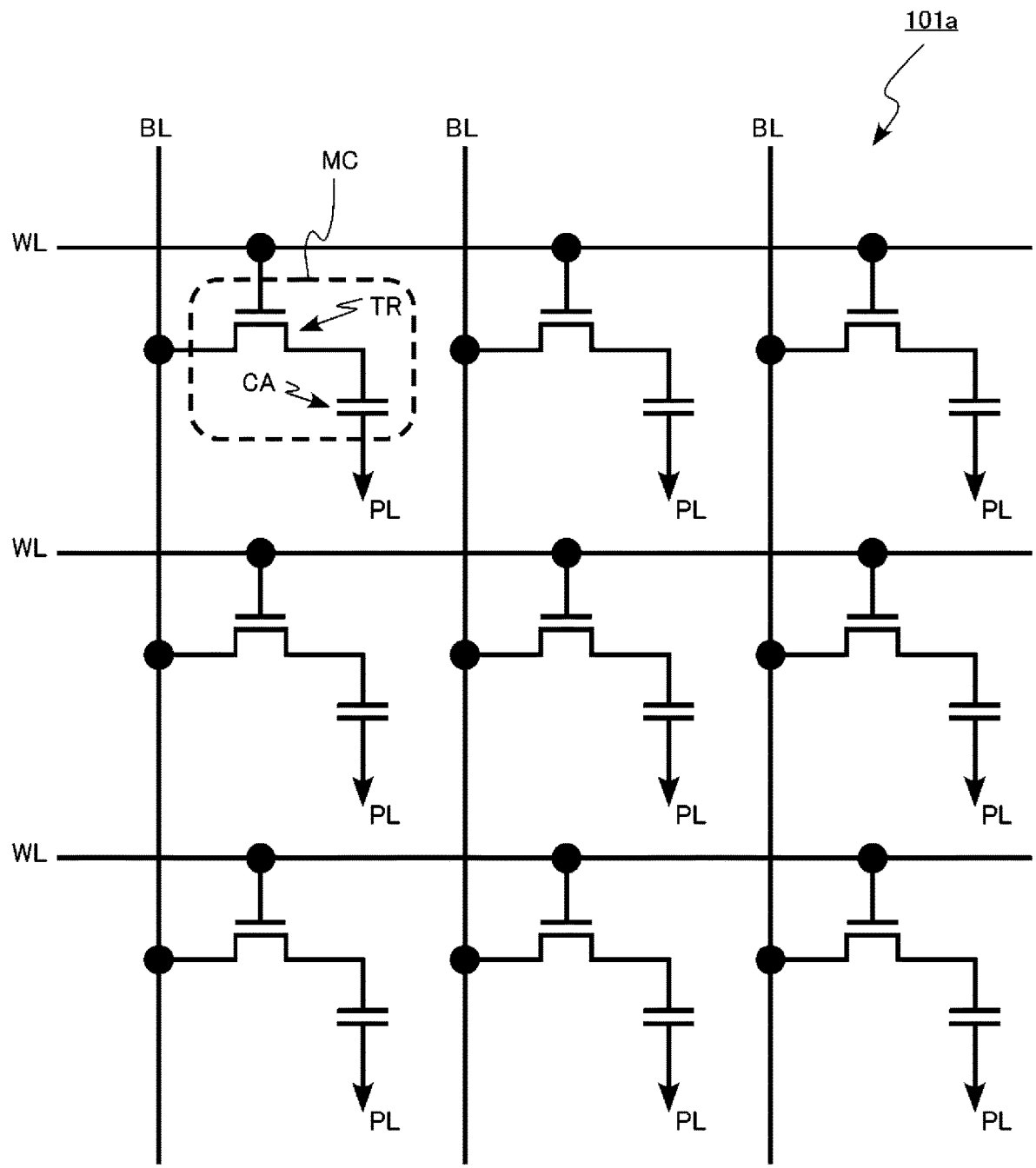
FIG. 5 is an equivalent circuit diagram illustrating a part of a memory cell array of the semiconductor memory device according to the first embodiment.
Figure 6:
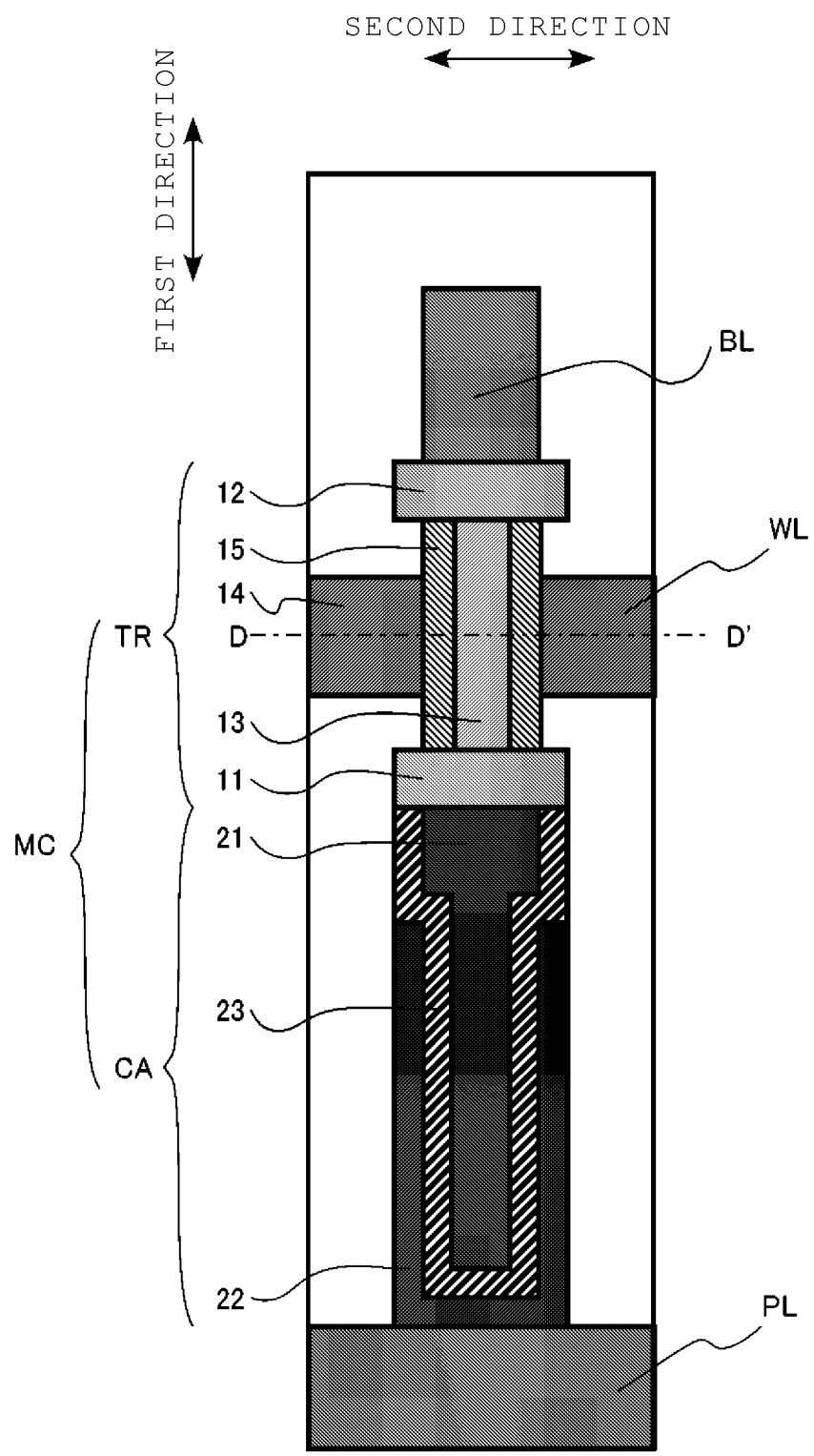
FIG. 6 is a schematic cross-sectional view illustrating a memory cell of the semiconductor memory device according to the first embodiment.
Figure 7:
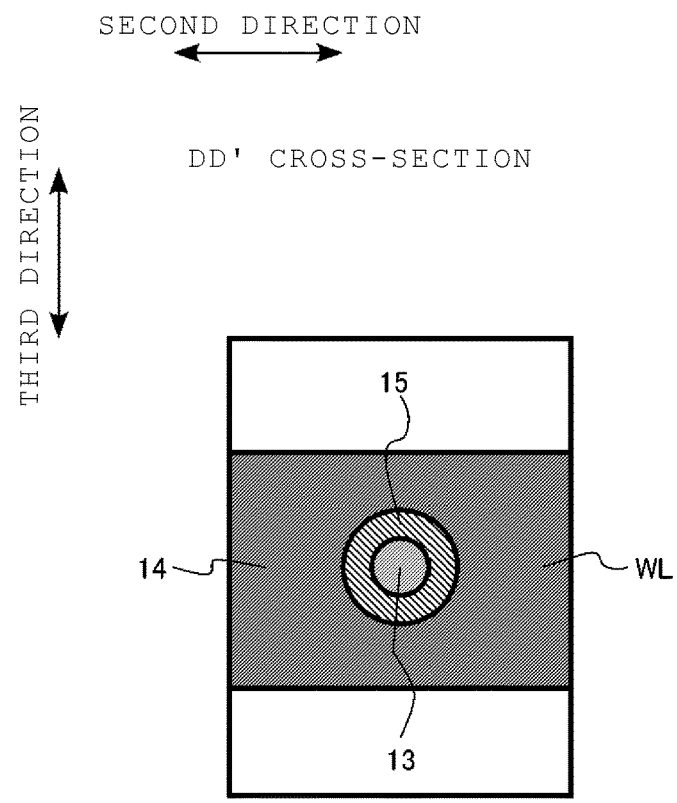
FIG. 7 is a schematic cross-sectional view illustrating the memory cell of the semiconductor memory device according to the first embodiment.

FIG. 5 is an equivalent circuit diagram illustrating a part of the memory cell array of the semiconductor memory device according to the first embodiment. FIGS. 6 and 7 are schematic cross-sectional views illustrating the memory cell of the semiconductor memory device according to the first embodiment. FIG. 7 is a DD' cross-sectional view of FIG. 6.

The semiconductor memory device according to the first embodiment is a DRAM 100. FIG. 4 is a layout diagram of the DRAM 100. FIG. 4 is an image illustrating a chip of the DRAM 100 when seen from the top.

As illustrated in FIG. 4, the DRAM 100 includes a memory cell array portion 101 and a peripheral circuit portion 102. The memory cell array portion 101 is surrounded by, for example, the peripheral circuit portion 102.

The peripheral circuit portion 102 has a function of implementing memory operations of memory cells MC in the memory cell array portion 101. The peripheral circuit portion 102 includes, for example, a sense amplifier circuit or a word line driver circuit.

As illustrated in FIG. 1, the memory cell array portion 101 includes a memory cell array 101a and a wiring region 101b on the memory cell array 101a.

As illustrated in FIG. 5, the memory cell array 101a includes a plurality of memory cells MC. In FIG. 5, a portion surrounded by a broken line is one memory cell MC. In the memory cell array 101a, the plurality of memory cells MC are two-dimensionally located. The memory cell array 101a includes a plurality of word lines WL, a plurality of bit lines BL, and a plate line PL.

The memory cell MC includes an oxide semiconductor transistor TR and a capacitor CA. The memory cell MC is connected to the word line WL, the bit line BL, and the plate line PL. By selecting one word line WL and one bit line BL, one memory cell MC can be selected.

The oxide semiconductor transistor TR functions as a switching transistor of the memory cell MC. The capacitor CA has a function of storing charge. The charge stored in the capacitor CA is a base of data stored in the memory cell MC.

The word line WL has a function of applying a gate voltage to a gate electrode of the oxide semiconductor transistor TR. The bit line BL has a function of storing charge in the capacitor CA or reading charge stored in the capacitor CA using the oxide semiconductor transistor TR.

As illustrated in FIGS. 6 and 7, the oxide semiconductor transistor TR includes a lower electrode 11, an upper electrode 12, an oxide semiconductor layer 13, a gate electrode 14, and a gate insulating layer 15. As illustrated in FIG. 6, the capacitor CA includes a cell electrode 21, a plate electrode 22, and a capacitor insulating film 23.

The lower electrode 11 and the upper electrode 12 function as a source electrode or a drain electrode of the oxide semiconductor transistor TR. The lower electrode 11 and the upper electrode 12 are conductors.

The lower electrode 11 is electrically connected to the capacitor CA. The lower electrode 11 is electrically connected to the cell electrode 21. The upper electrode 12 is electrically connected to the bit line BL.

The lower electrode 11 and the upper electrode 12 are conductors. The lower electrode 11 and the upper electrode 12 contain, for example, an oxide conductor. The lower electrode 11 and the upper electrode 12 contain, for example, indium (In), tin (Sn), and oxygen (O). The lower electrode 11 and the upper electrode 12 contain, for example, indium tin oxide. The lower electrode 11 and the upper electrode 12 are, for example, indium tin oxide layers.

The oxide semiconductor layer 13 is provided between the lower electrode 11 and the upper electrode 12. The oxide semiconductor layer 13 is in contact with, for example, the lower electrode 11 and the upper electrode 12.

In the oxide semiconductor layer 13, a channel that functions as a current path during an ON operation of the oxide semiconductor transistor TR is formed. In the oxide semiconductor layer 13, for example, an oxygen vacancy is present. The oxygen vacancy in the oxide semiconductor layer 13 functions as a donor.

The oxide semiconductor layer 13 is an oxide semiconductor. The oxide semiconductor layer 13 is, for example, amorphous.

The oxide semiconductor layer 13 contains at least one element selected from the group consisting of indium (In), gallium (Ga), silicon (Si), aluminum (Al), and tin (Sn), zinc (Zn), and oxygen (O). The oxide semiconductor layer 13 contains, for example, indium (In), gallium (Ga), zinc (Zn), and oxygen (O). The oxide semiconductor layer 13 contains, for example, indium gallium zinc oxide. The oxide semiconductor layer 13 is, for example, an indium gallium zinc oxide layer.

The gate electrode 14 faces the oxide semiconductor layer 13. As illustrated in FIG. 7, the gate electrode 14 surrounds the oxide semiconductor layer 13. The gate electrode 14 is formed on the same layer as the word line WL. The gate electrode 14 is continuous to the word line WL.

The oxide semiconductor transistor TR is a so-called surrounding gate transistor (SGT). The oxide semiconductor transistor TR has a so-called gate all around structure (GAA structure).

The gate electrode 14 is a conductor. The gate electrode 14 is, for example, a metal, a metal compound, or a semiconductor. The gate electrode 14 contains, for example, tungsten (W).

The gate insulating layer 15 is provided between the oxide semiconductor layer 13 and the gate electrode 14. The gate insulating layer 15 surrounds the oxide semiconductor layer 13. The gate insulating layer 15 is provided, for example, between the lower electrode 11 and the upper electrode 12.

The gate insulating layer 15 is, for example, an oxide, a nitride, or an oxynitride. The gate insulating layer 15 contains, for example, silicon oxide, aluminum oxide, silicon nitride, aluminum nitride, or silicon oxynitride. The gate insulating layer 15 is, for example, a silicon oxide layer, an aluminum oxide layer, a silicon nitride layer, an aluminum nitride layer, or a silicon oxynitride layer. The gate insulating layer 15 may have, for example, a stacked structure including two or more types of insulating layers.

The cell electrode 21 is electrically connected to the lower electrode 11. The cell electrode 21 is a conductor. The cell electrode 21 is, for example, a metal or a metal nitride. The cell electrode 21 is, for example, titanium nitride.

The plate electrode 22 is electrically connected to the plate line PL. The plate line PL has a function of applying a plate voltage to the plate electrode 22 of the memory cell MC.

The plate electrode 22 is a conductor. The plate electrode 22 is, for example, a metal or a metal nitride. The plate electrode 22 is, for example, titanium nitride.

The capacitor insulating film 23 is provided between the cell electrode 21 and the plate electrode 22. The capacitor insulating film 23 contains a metal oxide. The capacitor insulating film 23 may have, for example, a stacked structure including zirconium oxide, aluminum oxide, and zirconium oxide.

As illustrated in FIG. 1, the memory cell array portion 101 includes the memory cell array 101a and the wiring region 101b on the memory cell array 101a. In FIG. 1, the portion surrounded by a broken line is one memory cell MC.

As illustrated in FIG. 1, the memory cell array portion 101 includes a silicon substrate 30, a substrate insulating layer 32, an inter-cell insulating layer 34, a cell array upper insulating layer 36, a first barrier insulating layer 38, an interlayer insulating layer 40, a protective insulating layer 42, a second barrier insulating layer 44, a cap insulating layer 46, a first metal wiring layer 48, a second metal wiring layer 50, a third cavity 52, the plate line PL, the plurality of word lines WL, and the plurality of bit lines BL.

The silicon substrate 30 is an example of the semiconductor layer. The inter-cell insulating layer 34 is an example of the sixth insulating layer. The cell array upper insulating layer 36 is an example of the fifth insulating layer. The first barrier insulating layer 38 is an example of the fourth insulating layer. The protective insulating layer 42 is an example of the first insulating layer. The second barrier insulating layer 44 is an example of the second insulating layer. The cap insulating layer 46 is an example of the third insulating layer. The first metal wiring layer 48 is an example of the first wiring layer. The second metal wiring layer 50 is an example of the third wiring layer. The bit line BL is an example of the second wiring layer.

The silicon substrate 30 is, for example, single-crystal silicon. In the peripheral circuit portion 102, for example, a transistor that uses a part of the silicon substrate 30 as a channel is formed.

The substrate insulating layer 32 is provided on the silicon substrate 30. The substrate insulating layer 32 has, for example, a function of electrically isolating the silicon substrate 30 and the memory cell array 101a from each other.

The substrate insulating layer 32 contains an insulator. The substrate insulating layer 32 contains, for example, silicon oxide. The substrate insulating layer 32 is, for example, a silicon oxide layer.

The plate line PL is provided on the substrate insulating layer 32. The plate line PL is provided on a lowermost layer of the memory cell array 101a. The plate line PL is electrically connected to the plate electrode 22 of the memory cell MC.

The plate line PL contains a conductor. The plate line PL is, for example, a metal or a metal nitride.

The inter-cell insulating layer 34 is provided on the silicon substrate 30. The inter-cell insulating layer 34 has, for example, a function of electrically isolating the memory cell MC and the memory cell MC from each other.

The inter-cell insulating layer 34 contains an insulator. The inter-cell insulating layer 34 contains, for example, silicon oxide. The inter-cell insulating layer 34 is, for example, a silicon oxide layer.

The word line WL is connected to the gate electrode 14 of the memory cell MC.

The word line WL contains a conductor. The word line WL is, for example, a metal or a metal nitride. The word line WL contains, for example, tungsten (W). The word line WL is, for example, a tungsten layer.

The bit line BL is provided on the inter-cell insulating layer 34. The bit line BL is provided on an uppermost layer of the memory cell array 101a. The bit line BL is provided between the memory cell MC and the first barrier insulating layer 38. The plurality of bit lines BL are provided between the plurality of memory cells MC and the first barrier insulating layer 38. The bit line BL is electrically connected to, for example, the upper electrode 12 of the memory cell MC.

The bit line BL contains a conductor. The bit line BL is, for example, a metal or a metal nitride. The bit line BL contains, for example, tungsten (W). The bit line BL is, for example, a tungsten layer.

The cell array upper insulating layer 36 is provided on the inter-cell insulating layer 34. The cell array upper insulating layer 36 is provided between the memory cell array 101a and the first barrier insulating layer 38.

The cell array upper insulating layer 36 is provided between the bit line BL and the first barrier insulating layer 38. A part of the cell array upper insulating layer 36 is provided, for example, between the bit line BL and the bit line BL.

The cell array upper insulating layer 36 contains an insulator. The cell array upper insulating layer 36 contains, for example, silicon oxide. The cell array upper insulating layer 36 is, for example, a silicon oxide layer.

The first barrier insulating layer 38 is provided on the cell array upper insulating layer 36. The first barrier insulating layer 38 is provided between the memory cell array 101a and the first metal wiring layer 48. The first barrier insulating layer 38 is provided between the cell array upper insulating layer 36 and the interlayer insulating layer 40.

The first barrier insulating layer 38 includes an opening provided between the cell array upper insulating layer 36 and a part of the cap insulating layer 46 surrounded by the second barrier insulating layer 44.

For example, when the DRAM 100 is manufactured, the first barrier insulating layer 38 functions as a barrier layer to oxygen.

The first barrier insulating layer 38 contains an insulator. The first barrier insulating layer 38 contains at least one insulator selected from the group consisting of aluminum oxide, yttrium oxide, zirconium oxide, lanthanum oxide, hafnium oxide, tantalum oxide, silicon nitride, aluminum nitride, silicon oxynitride, aluminum oxynitride, and nitrogen-doped silicon carbide. The first barrier insulating layer 38 is an aluminum oxide layer, a yttrium oxide layer, a zirconium oxide layer, a lanthanum oxide layer, a hafnium oxide layer, a tantalum oxide layer, a silicon nitride layer, an aluminum nitride layer, a silicon oxynitride layer, an aluminum oxynitride layer, or a nitrogen-doped silicon carbide layer.

The first barrier insulating layer 38 is formed of a material having a lower oxygen transmission rate than the interlayer insulating layer 40. The first barrier insulating layer 38 is formed of, for example, a material having a lower oxygen transmission rate than silicon oxide.

The interlayer insulating layer 40 is provided on the first barrier insulating layer 38. The interlayer insulating layer 40 is provided between the first barrier insulating layer 38 and the protective insulating layer 42.

The interlayer insulating layer 40 is provided between the first barrier insulating layer 38 and the first metal wiring layer 48. The interlayer insulating layer 40 is provided between the first metal wiring layer 48 and the second metal wiring layer 50. The interlayer insulating layer 40 is provided between the second metal wiring layer 50 and the protective insulating layer 42.

The interlayer insulating layer 40 contains an insulator. The interlayer insulating layer 40 contains, for example, silicon oxide. The interlayer insulating layer 40 is, for example, a silicon oxide layer.

The protective insulating layer 42 is provided on the interlayer insulating layer 40. The protective insulating layer 42 is provided between the interlayer insulating layer 40 and the cap insulating layer 46.

The protective insulating layer 42 contains an insulator. The protective insulating layer 42 includes, for example, a material different from that of the interlayer insulating layer 40. The protective insulating layer 42 is formed of, for example, a material different from that of the interlayer insulating layer 40. The protective insulating layer 42 contains, for example, silicon nitride. The protective insulating layer 42 is, for example, a silicon nitride layer.

The protective insulating layer 42 is formed of, for example, a material having a lower oxygen transmission rate than the interlayer insulating layer 40. The protective insulating layer 42 is formed of, for example, a material having a lower oxygen transmission rate than silicon oxide.

The first metal wiring layer 48 is provided in the wiring region 101b. The first metal wiring layer 48 is provided between the memory cell array 101a and the protective insulating layer 42. The first metal wiring layer 48 is provided between the first barrier insulating layer 38 and the protective insulating layer 42. The first metal wiring layer 48 is provided in the interlayer insulating layer 40.

The first metal wiring layer 48 contains a conductor. The first metal wiring layer 48 is, for example, a metal. The first metal wiring layer 48 contains, for example, copper (Cu) or aluminum (Al). The first metal wiring layer 48 is, for example, a copper layer or an aluminum layer.

The second metal wiring layer 50 is provided in the wiring region 101b. The second metal wiring layer 50 is provided between the memory cell array 101a and the protective insulating layer 42. The second metal wiring layer 50 is provided between the first barrier insulating layer 38 and the protective insulating layer 42. The second metal wiring layer 50 is provided between the first metal wiring layer 48 and the protective insulating layer 42. The second metal wiring layer 50 is provided in the interlayer insulating layer 40.

The second metal wiring layer 50 contains a conductor. The second metal wiring layer 50 is, for example, a metal. The second metal wiring layer 50 contains, for example, copper (Cu) or aluminum (Al). The second metal wiring layer 50 is, for example, a copper layer or an aluminum layer.

The second barrier insulating layer 44 extends in a first direction from the memory cell array 101a toward the protective insulating layer 42. The first direction is an up-down direction in FIG. 1.

A direction perpendicular to the first direction is called a second direction. In addition, a direction perpendicular to the first direction and the second direction is called a third direction. For example, a left-right direction in FIG. 1 is the second direction. In addition, for example, a left-right direction in FIGS. 2 and 3 is the second direction, and an up-down direction in FIGS. 2 and 3 is the third direction.

A first distance (d1 in FIG. 1) in the first direction from a first end of the second barrier insulating layer 44 to the memory cell array 101a is less than a second distance (d2 in FIG. 1) in the first direction from the first metal wiring layer 48 to the memory cell array 101a. In other words, the first distance d1 in the first direction from the end portion of the second barrier insulating layer 44 on the memory cell array 101a side to the bit line BL is less than the second distance d2 in the first direction from the first metal wiring layer 48 to the bit line BL.

The first end of the second barrier insulating layer 44 is, for example, in contact with the first barrier insulating layer 38. In other words, the end portion of the second barrier insulating layer 44 on the memory cell array 101a side is, for example, in contact with the first barrier insulating layer 38.

In addition, a third distance (d3 in FIG. 1) in the first direction from a second end of the second barrier insulating layer 44 to the memory cell array 101a is greater than a fourth distance (d4 in FIG. 1) in the first direction from the protective insulating layer 42 to the memory cell array 101a. In other words, the third distance d3 in the first direction from the end portion of the second barrier insulating layer 44 opposite to the memory cell array 101a to the memory cell array 101a is greater than the fourth distance d4 in the first direction from the protective insulating layer 42 to the memory cell array 101a.

The second end of the second barrier insulating layer 44 is, for example, in contact with the protective insulating layer 42. In other words, the end portion of the second barrier insulating layer 44 opposite to the memory cell array 101a is, for example, in contact with the protective insulating layer 42.

The second barrier insulating layer 44 is provided between the cell array upper insulating layer 36 and the cap insulating layer 46.

As illustrated in FIG. 2, the second barrier insulating layer 44 has an annular shape in a first cross-section perpendicular to the first direction. The AA' cross-section illustrated in FIG. 2 is an example of the first cross-section. As illustrated in FIG. 2, for example, the second barrier insulating layer 44 is surrounded by the interlayer insulating layer 40.

As illustrated in FIG. 4, a plurality of second barrier insulating layers 44 are provided in the memory cell array portion 101. The plurality of second barrier insulating layers 44 are provided on the memory cell array 101a.

For example, when the DRAM 100 is manufactured, the second barrier insulating layer 44 functions as a barrier layer to oxygen.

The second barrier insulating layer 44 contains an insulator. The second barrier insulating layer 44 contains at least one insulator selected from the group consisting of aluminum oxide, yttrium oxide, zirconium oxide, lanthanum oxide, hafnium oxide, tantalum oxide, silicon nitride, aluminum nitride, silicon oxynitride, aluminum oxynitride, and nitrogen-doped silicon carbide. The second barrier insulating layer 44 is, for example, an aluminum oxide layer, a yttrium oxide layer, a zirconium oxide layer, a lanthanum oxide layer, a hafnium oxide layer, a tantalum oxide layer, a silicon nitride layer, an aluminum nitride layer, a silicon oxynitride layer, an aluminum oxynitride layer, or a nitrogen-doped silicon carbide layer.

The second barrier insulating layer 44 is formed of a material having a lower oxygen transmission rate than the interlayer insulating layer 40. The second barrier insulating layer 44 is formed of, for example, a material having a lower oxygen transmission rate than silicon oxide.

As illustrated in FIG. 1, the third cavity 52 is provided in the wiring region 101b of the memory cell array portion 101. As illustrated in FIG. 3, the third cavity 52 is surrounded by the second barrier insulating layer 44 in a second cross-section perpendicular to the first direction. The BB' cross-section illustrated in FIG. 3 is an example of the second cross-section.

The third cavity 52 is provided between the cell array upper insulating layer 36 and the cap insulating layer 46. The third cavity 52 is, for example, in contact with the cell array upper insulating layer 36. The third cavity 52 is, for example, a space surrounded by the cell array upper insulating layer 36, the cap insulating layer 46, the first barrier insulating layer 38, and the second barrier insulating layer 44.

The cap insulating layer 46 is provided on the protective insulating layer 42. The protective insulating layer 42 is provided between the memory cell array 101a and the cap insulating layer 46. The second barrier insulating layer 44 is provided between the memory cell array 101a and the cap insulating layer 46.

As illustrated in FIG. 2, a part of the cap insulating layer 46 is surrounded by the second barrier insulating layer 44 in the first cross-section perpendicular to the first direction. The AA' cross-section illustrated in FIG. 2 is an example of the first cross-section. As illustrated in FIG. 2, for example, a part of the cap insulating layer 46 is surrounded by the interlayer insulating layer 40.

For example, the cap insulating layer 46 has, for example, a function of preventing moisture from the outside from permeating into the DRAM 100 through the inside of the second barrier insulating layer 44.

The cap insulating layer 46 contains an insulator. The cap insulating layer 46 contains, for example, a nitride, an oxynitride, or a resin. The cap insulating layer 46 contains, for example, silicon nitride, silicon oxynitride, or a polyimide resin. The cap insulating layer 46 is, for example, a silicon nitride layer, a silicon oxynitride layer, or a polyimide resin layer.

The cap insulating layer 46 may have, for example, a stacked structure including two or more types of insulating layers. The cap insulating layer 46 has, for example, a stacked structure including a silicon oxide layer and a silicon nitride layer.

Next, an example of a method of manufacturing the semiconductor memory device according to the first embodiment will be described.

FIGS. 8, 9, 10, 11, 12, 13, and 14 are schematic cross-sectional views illustrating the example of the method of manufacturing the semiconductor memory device according to the first embodiment. Each of FIGS. 8 to 14 illustrates the cross-section corresponding to FIG. 1. FIGS. 8 to 14 are diagrams illustrating the example of the method of manufacturing the memory cell array portion 101 of the DRAM 100.

Figure 8:
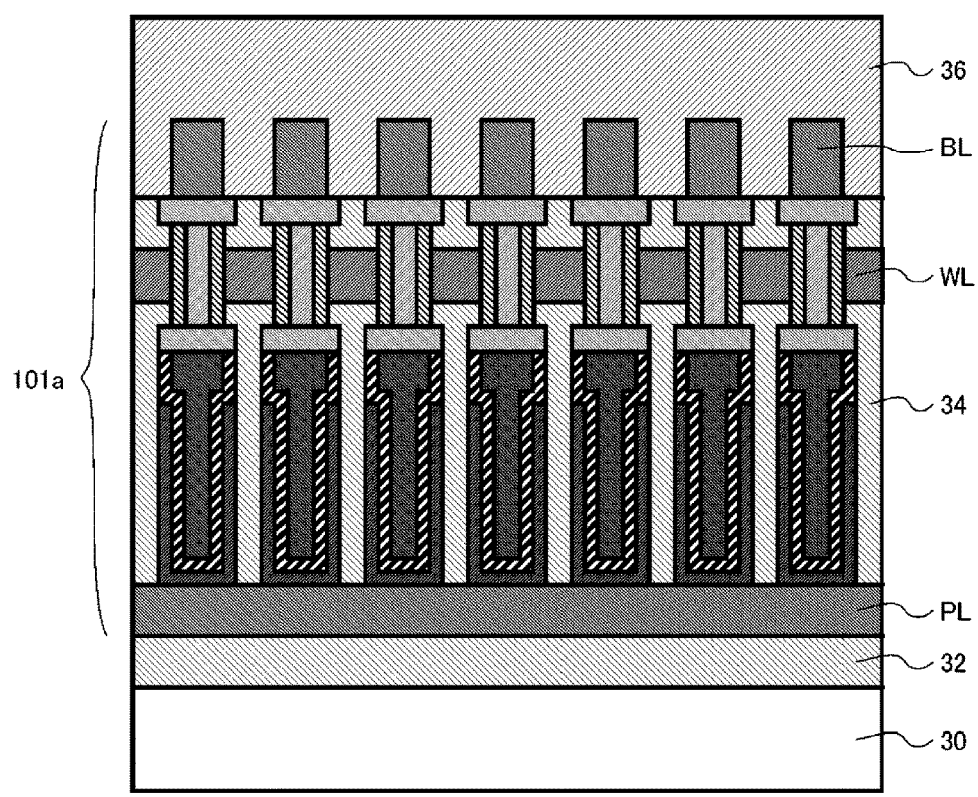
FIG. 8 is a schematic cross-sectional view illustrating an example of a method of manufacturing the semiconductor memory device according to the first embodiment.

First, using a well-known process technique, the substrate insulating layer 32 and the memory cell array 101a are formed on the silicon substrate 30. Next, for example, using a chemical vapor deposition method (CVD method), the cell array upper insulating layer 36 is formed (FIG. 8). The cell array upper insulating layer 36 is, for example, a silicon oxide layer.

Next, the first barrier insulating layer 38 is formed on the cell array upper insulating layer 36, for example, using the CVD method. The first barrier insulating layer 38 is, for example, a silicon nitride layer.

Next, the wiring region 101b is formed on the first barrier insulating layer 38 using a well-known process technique. The wiring region 101b includes, the first metal wiring layer 48, the second metal wiring layer 50, and the interlayer insulating layer 40.

The first metal wiring layer 48 and the second metal wiring layer 50 are, for example, copper layers. The interlayer insulating layer 40 is, for example, a silicon oxide layer.

Figure 9:
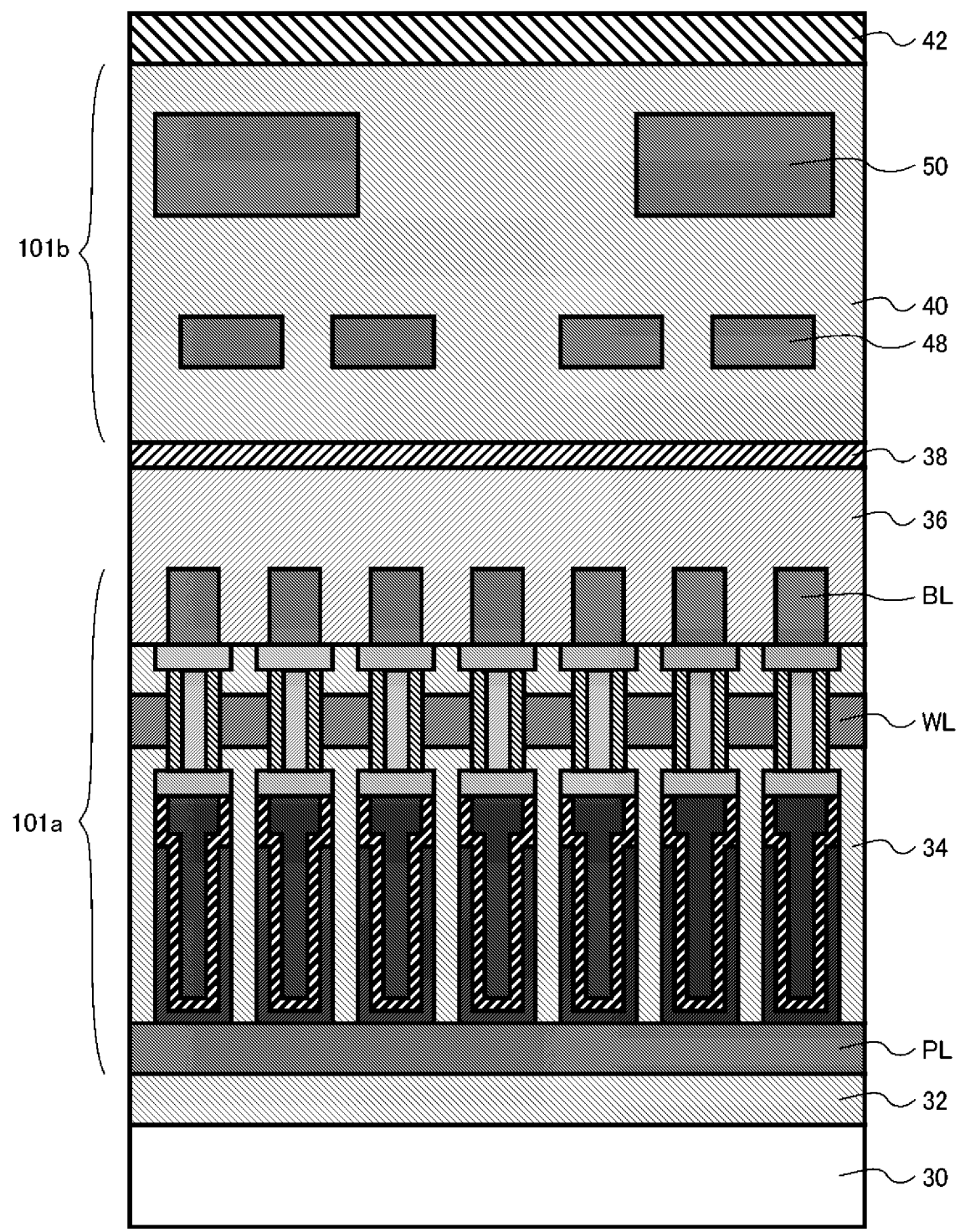
FIG. 9 is a schematic cross-sectional view illustrating the example of the method of manufacturing the semiconductor memory device according to the first embodiment.

Next, the protective insulating layer 42 is formed on the interlayer insulating layer 40, for example, using the CVD method (FIG. 9). The protective insulating layer 42 is, for example, a silicon nitride layer.

Figure 10:
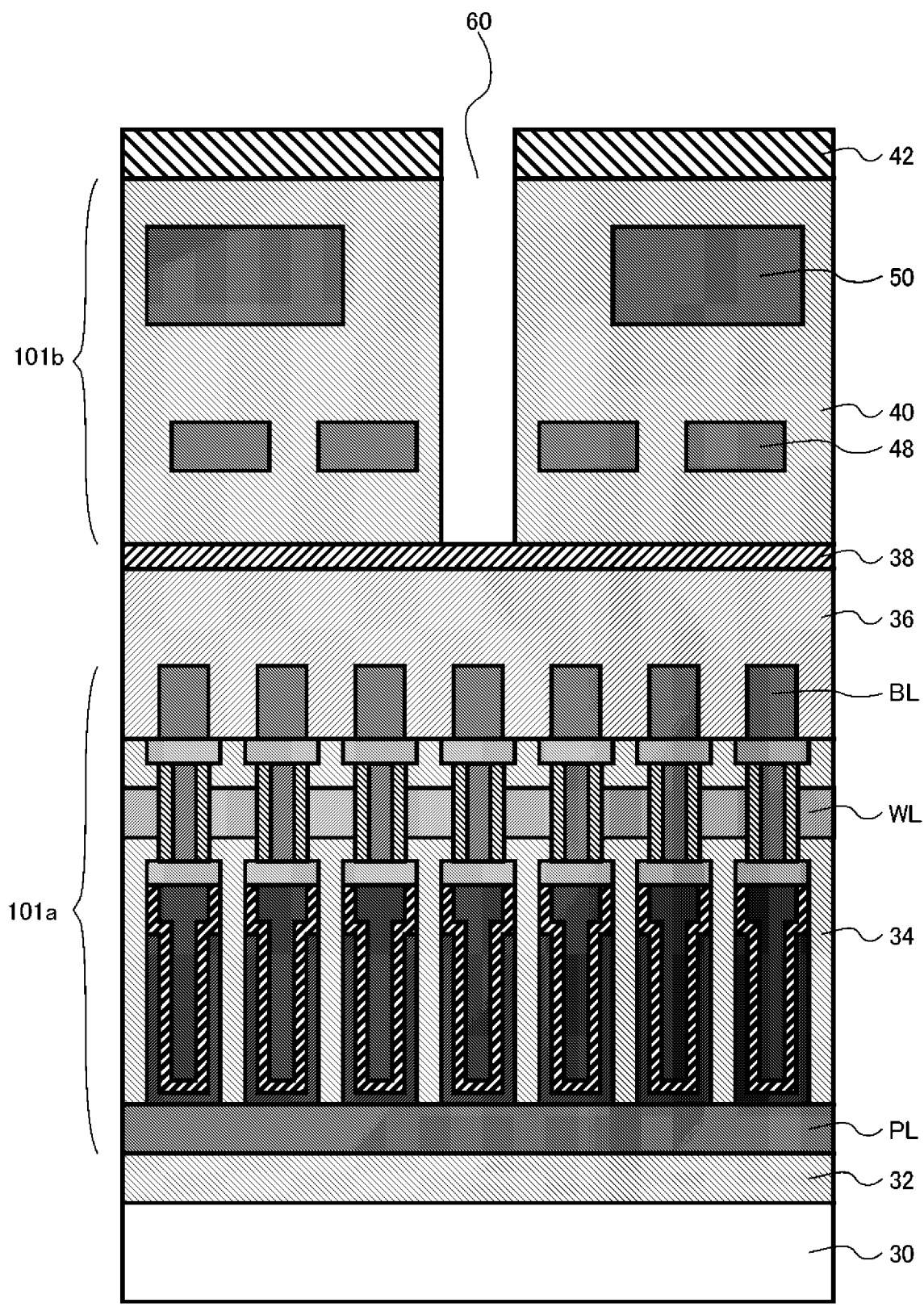
FIG. 10 is a schematic cross-sectional view illustrating the example of the method of manufacturing the semiconductor memory device according to the first embodiment.

Next, an opening 60 that penetrates the protective insulating layer 42 and interlayer insulating layer 40 from the front surface of the protective insulating layer 42 and reaches the first barrier insulating layer 38 is formed (FIG. 10). The opening 60 is formed, for example, using a lithography method or a reactive ion etching method (RIE method).

When the interlayer insulating layer 40 is etched, for example, etching conditions that can ensure etching selectivity with respect to the first barrier insulating layer 38 are selected. The first barrier insulating layer 38 can be made to function as a stopper layer when the interlayer insulating layer 40 is etched. By making the first barrier insulating layer 38 function as the stopper layer, for example, the depth of the opening 60 is easily controlled.

Figure 11:
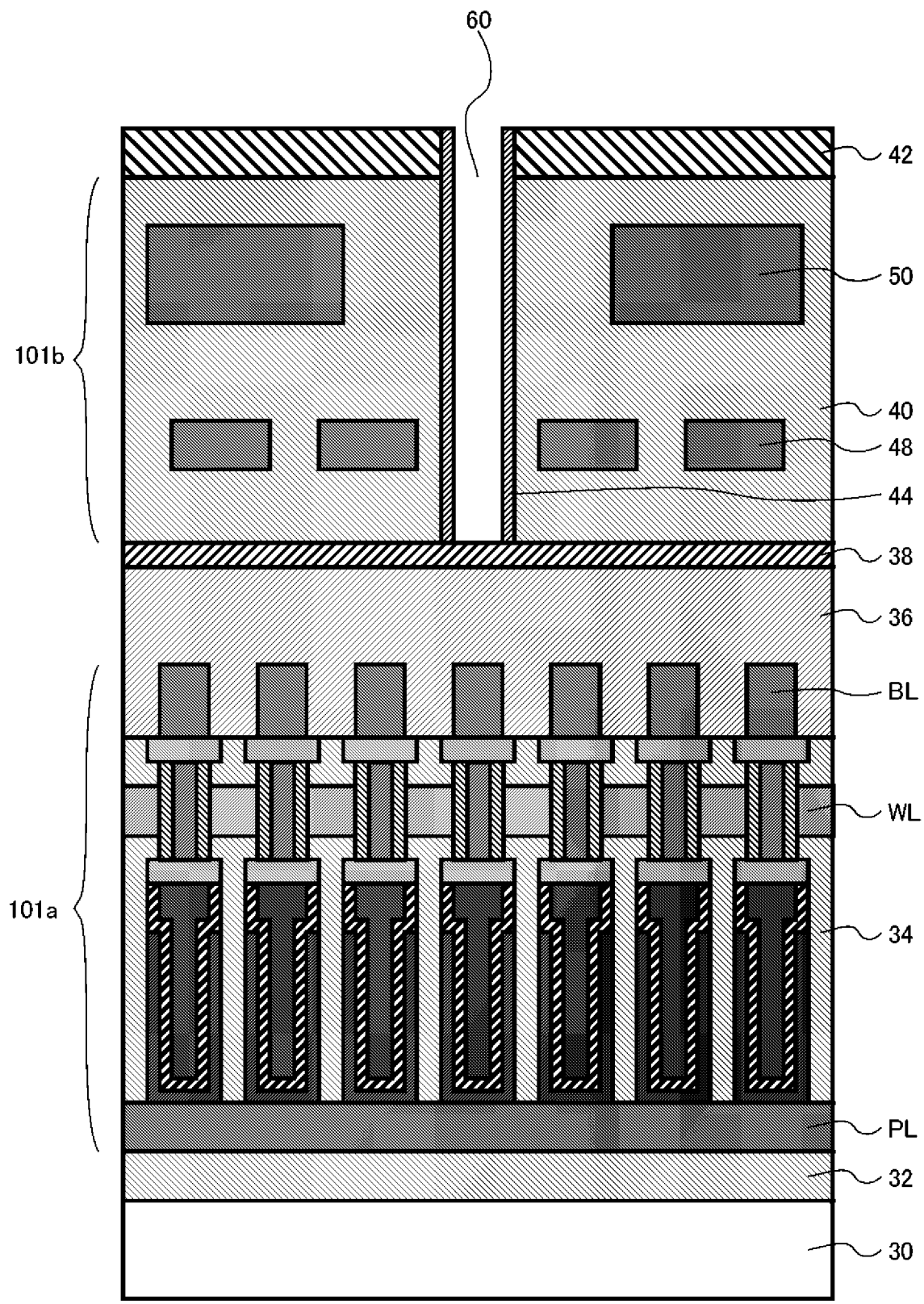
FIG. 11 is a schematic cross-sectional view illustrating the example of the method of manufacturing the semiconductor memory device according to the first embodiment.

Next, the second barrier insulating layer 44 is formed on a side wall of the opening 60 (FIG. 11). The second barrier insulating layer 44 is formed, for example, by etching using an Atomic Layer Deposition method (ALD method) and the RIE method. The second barrier insulating layer 44 is, for example, an aluminum oxide layer.

Figure 12:
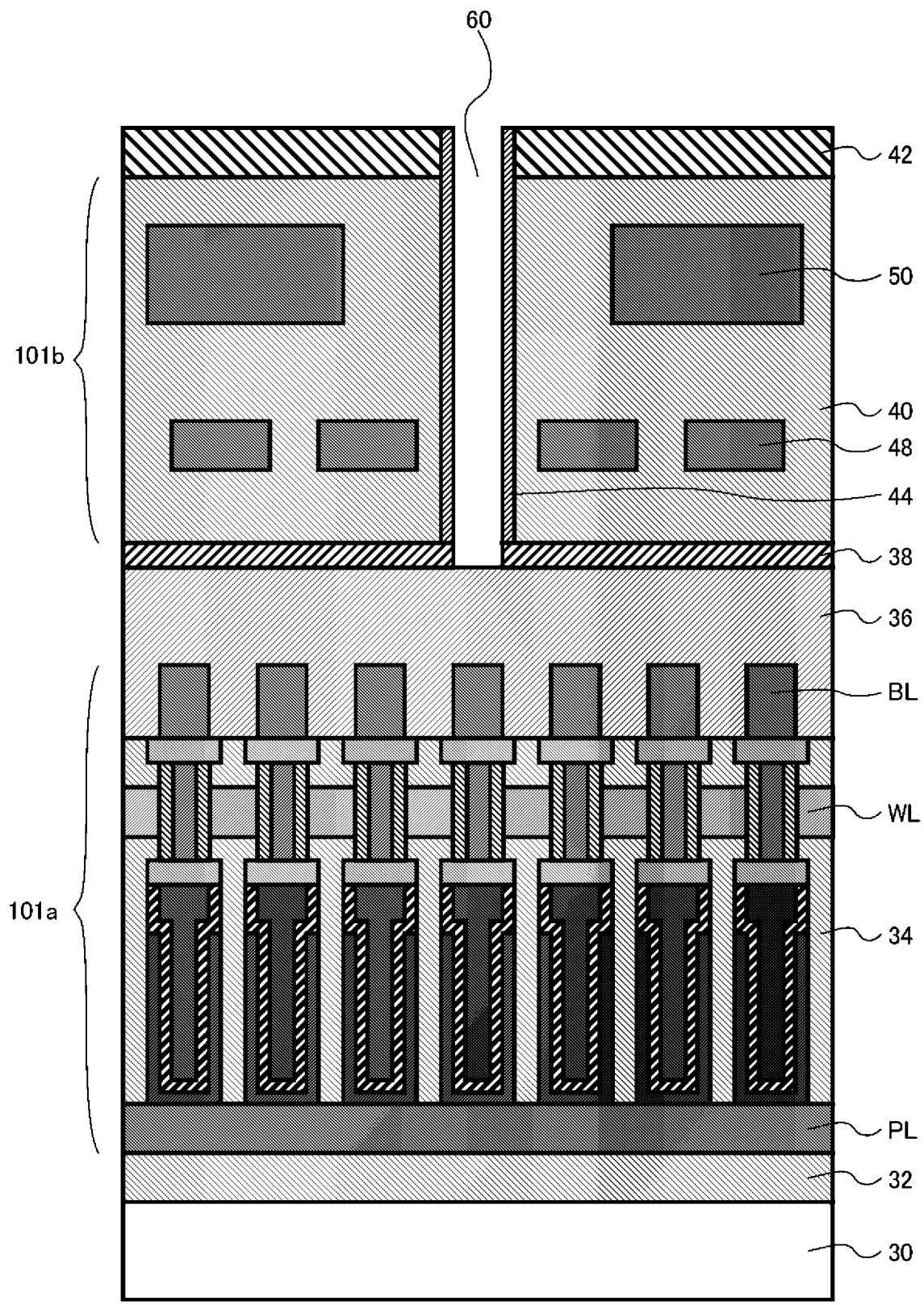
FIG. 12 is a schematic cross-sectional view illustrating the example of the method of manufacturing the semiconductor memory device according to the first embodiment.

Next, the first barrier insulating layer 38 that is exposed from a bottom surface of the opening 60 is removed to expose the cell array upper insulating layer 36 from the bottom surface of the opening 60 (FIG. 12). The first barrier insulating layer 38 is removed, for example, using a RIE method.

Figure 13:
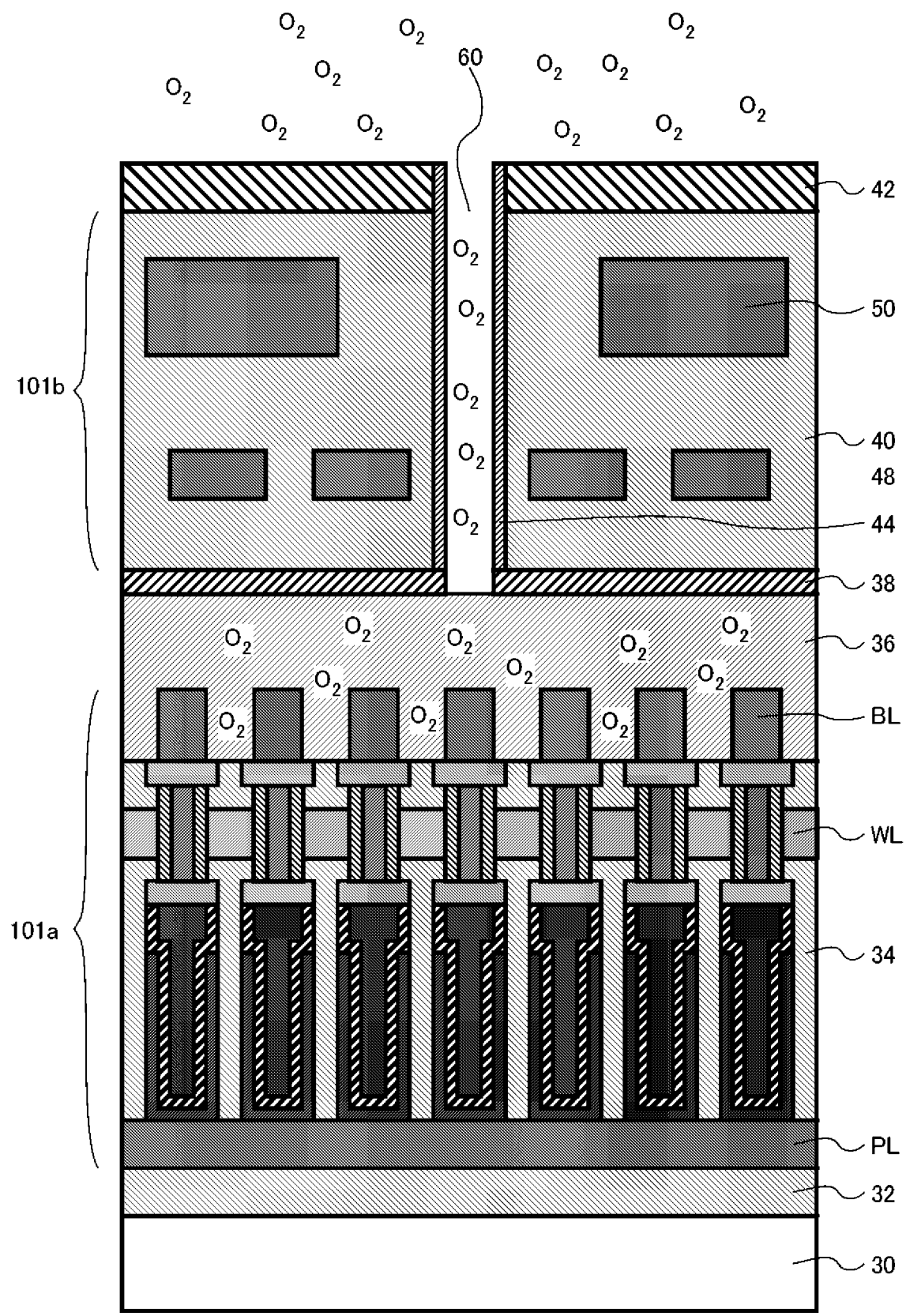
FIG. 13 is a schematic cross-sectional view illustrating the example of the method of manufacturing the semiconductor memory device according to the first embodiment.

Next, a heat treatment is performed in an atmosphere containing oxygen (O) (FIG. 13). The heat treatment is performed in an atmosphere containing oxygen gas ($O_2$). For example, oxygen is supplied to the memory cell array 101a through the opening 60. The heat treatment is so-called oxygen annealing.

In the memory cell array 101a, the oxide semiconductor transistor TR is present. By supplying oxygen to the memory cell array 101a, for example, oxygen is supplied to the oxide semiconductor layer 13 of the oxide semiconductor transistor TR, and the oxygen vacancy concentration of the oxide semiconductor layer 13 is reduced.

During the heat treatment in the atmosphere containing oxygen (O), the permeation of oxygen into the wiring region 101b is reduced by the first barrier insulating layer 38 having a low oxygen transmission rate, the second barrier insulating layer 44 having a low oxygen transmission rate, and the protective insulating layer 42 having a low oxygen transmission rate. Accordingly, for example, oxidation of the first metal wiring layer 48 or the second metal wiring layer 50 is prevented.

Figure 14:
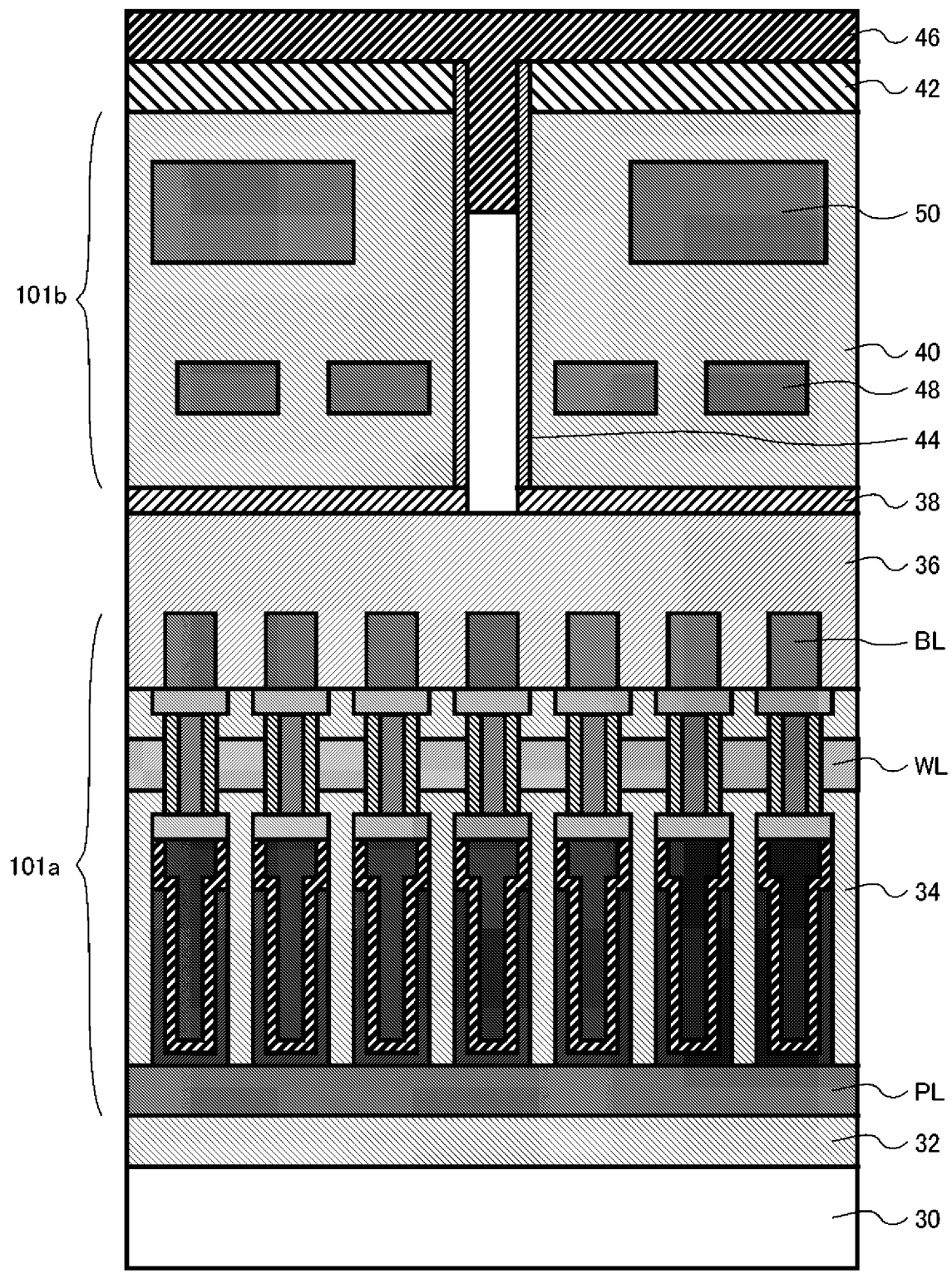
FIG. 14 is a schematic cross-sectional view illustrating the example of the method of manufacturing the semiconductor memory device according to the first embodiment.

Next, the cap insulating layer 46 is formed on the protective insulating layer 42, for example, using the CVD method (FIG. 14). At least an upper portion of the opening 60 is embedded with the cap insulating layer 46. The opening 60 may be completely embedded with the cap insulating layer 46.

The cap insulating layer 46 is, for example, a silicon nitride layer.

With the above-described manufacturing method, the memory cell array portion 101 of the DRAM 100 illustrated in FIG. 1 is manufactured.

Next, the operation and effects of the semiconductor memory device according to the first embodiment will be described.

Figure 15:
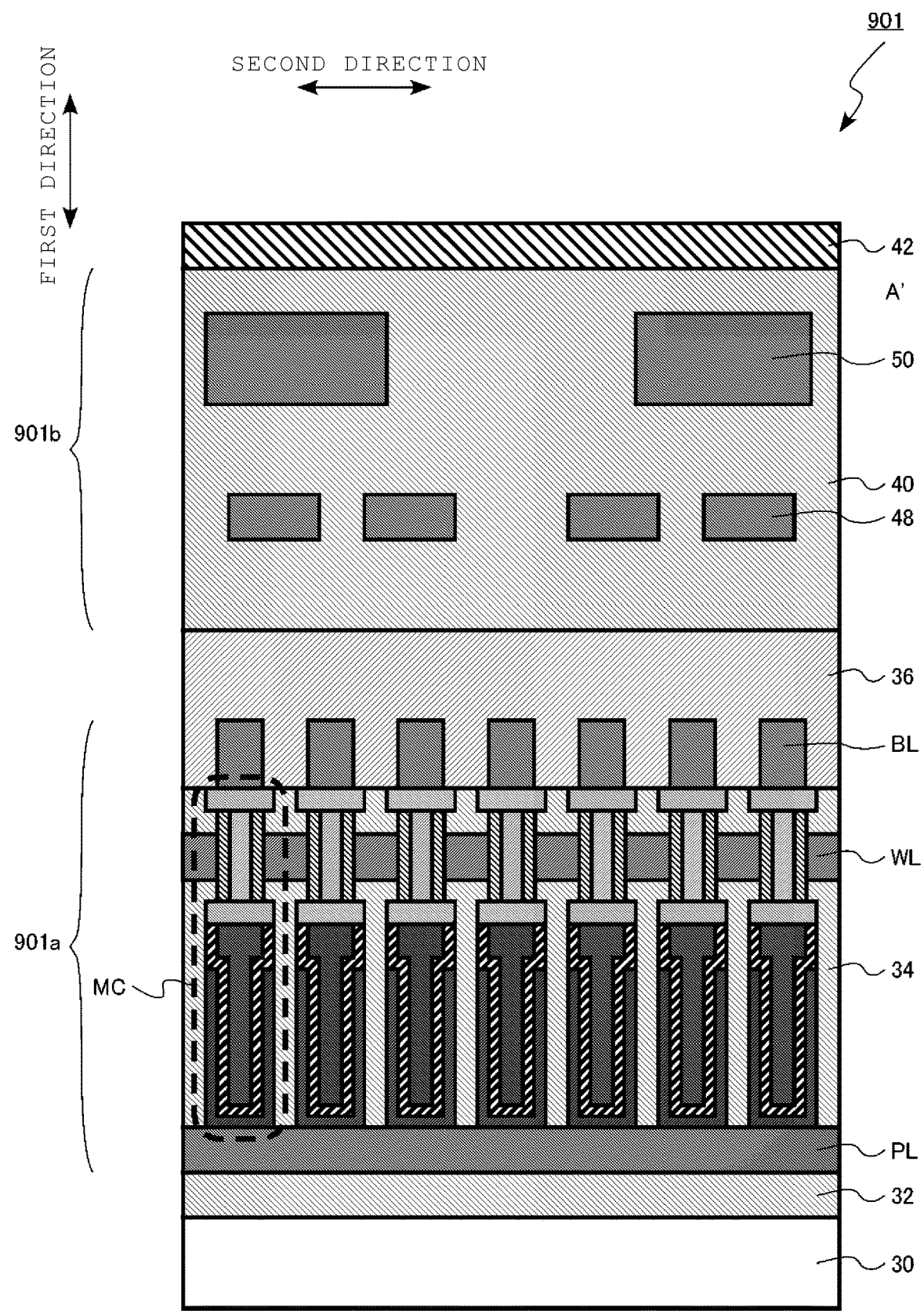
FIG. 15 is a schematic cross-sectional view illustrating a semiconductor memory device according to a comparative example.

FIG. 15 is a schematic cross-sectional view illustrating a semiconductor memory device according to a comparative example. FIG. 15 is a diagram corresponding to FIG. 1 according to the first embodiment. FIG. 15 is a schematic cross-sectional view illustrating a memory cell array portion 901 of a DRAM according to the comparative example.

The memory cell array portion 901 of the DRAM 900 according to the comparative example includes a memory cell array 901a and a wiring region 901b. The memory cell array portion 901 according to the comparative example is different from the memory cell array portion 101 of the DRAM 100 according to the first embodiment, in that it does not include the first barrier insulating layer 38 and the second barrier insulating layer 44.

When the memory cell array portion 901 according to the comparative example is manufactured, after forming the memory cell array 901a, the wiring region 901b is formed. When the wiring region 901b is formed, a heat treatment is performed multiple times to form a film or to anneal a film.

Through the heat treatment during the formation of the wiring region 901b, oxygen is removed from the oxide semiconductor layer 13 of the oxide semiconductor transistor TR. By removing oxygen from the oxide semiconductor layer 13, the oxygen vacancy concentration in the oxide semiconductor layer 13 increases. The oxygen vacancy concentration increases such that characteristics of the oxide semiconductor transistor TR deteriorate. For example, a threshold voltage of the oxide semiconductor transistor TR decreases.

The memory cell array portion 101 of the DRAM 100 according to the first embodiment includes the first barrier insulating layer 38 and the second barrier insulating layer 44.

In the DRAM 100 according to the first embodiment, after forming the wiring region 101b, oxygen can be supplied to the memory cell array 101a from the opening 60 where the second barrier insulating layer 44 is formed on the side wall. Therefore, oxygen can be supplied to the oxide semiconductor layer 13 of the oxide semiconductor transistor TR. Accordingly, through the heat treatment during the formation of the wiring region 101b, oxygen removed from the oxide semiconductor layer 13 can be compensated for. In addition, by including the first barrier insulating layer 38 and the second barrier insulating layer 44, oxidation of the first metal wiring layer 48 and the second metal wiring layer 50 in the wiring region 101b can be prevented.

Accordingly, the oxygen vacancy concentration in the oxide semiconductor layer 13 increased in the process of forming the wiring region 101b can be reduced. Accordingly, characteristic deterioration of the oxide semiconductor transistor TR can be recovered, and the DRAM 100 having excellent characteristics can be implemented.

In the DRAM 100 according to the first embodiment, from the viewpoint of preventing oxidation of the first metal wiring layer 48 and the second metal wiring layer 50, it is preferable that the first barrier insulating layer 38 contains at least one insulator selected from the group consisting of aluminum oxide, yttrium oxide, zirconium oxide, lanthanum oxide, hafnium oxide, tantalum oxide, silicon nitride, aluminum nitride, silicon oxynitride, aluminum oxynitride, and nitrogen-doped silicon carbide. It is more preferable that the first barrier insulating layer 38 contains silicon nitride or aluminum oxide.

In the DRAM 100 according to the first embodiment, from the viewpoint of preventing oxidation of the first metal wiring layer 48 and the second metal wiring layer 50, it is preferable that the second barrier insulating layer 44 contains at least one insulator selected from the group consisting of aluminum oxide, yttrium oxide, zirconium oxide, lanthanum oxide, hafnium oxide, tantalum oxide, silicon nitride, aluminum nitride, silicon oxynitride, aluminum oxynitride, and nitrogen-doped silicon carbide. It is more preferable that the second barrier insulating layer 44 includes silicon nitride or aluminum oxide.

In the DRAM 100 according to the first embodiment, from the viewpoint of preventing oxidation of the first metal wiring layer 48 and the second metal wiring layer 50, it is preferable that the protective insulating layer 42 contains silicon nitride.

In the DRAM 100 according to the first embodiment, from the viewpoint of preventing permeation of moisture from the outside, it is preferable that the cap insulating layer 46 contains silicon nitride.

As described above, with the first embodiment, characteristic deterioration during the manufacturing of the oxide semiconductor transistor can be recovered, and the DRAM 100 having excellent characteristics can be implemented.

Second Embodiment

A semiconductor memory device according to a second embodiment is different from the semiconductor memory device according to the first embodiment, in that the fifth insulating layer has a first cavity. Hereinafter, the description of a part of the same contents as those of the first embodiment will not be repeated.

Figure 16:
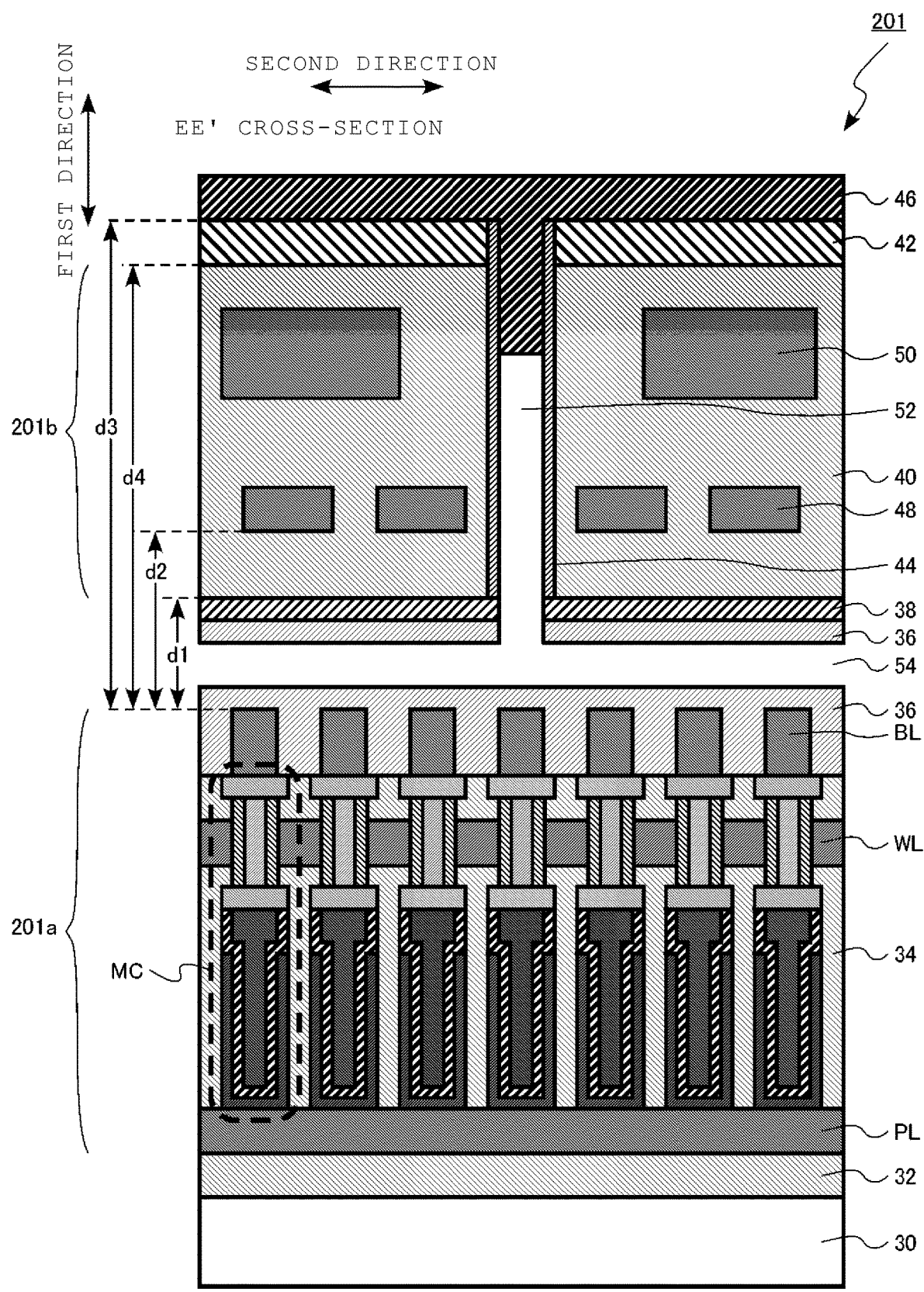
FIG. 16 is a schematic cross-sectional view illustrating a semiconductor memory device according to a second embodiment.
Figure 17:
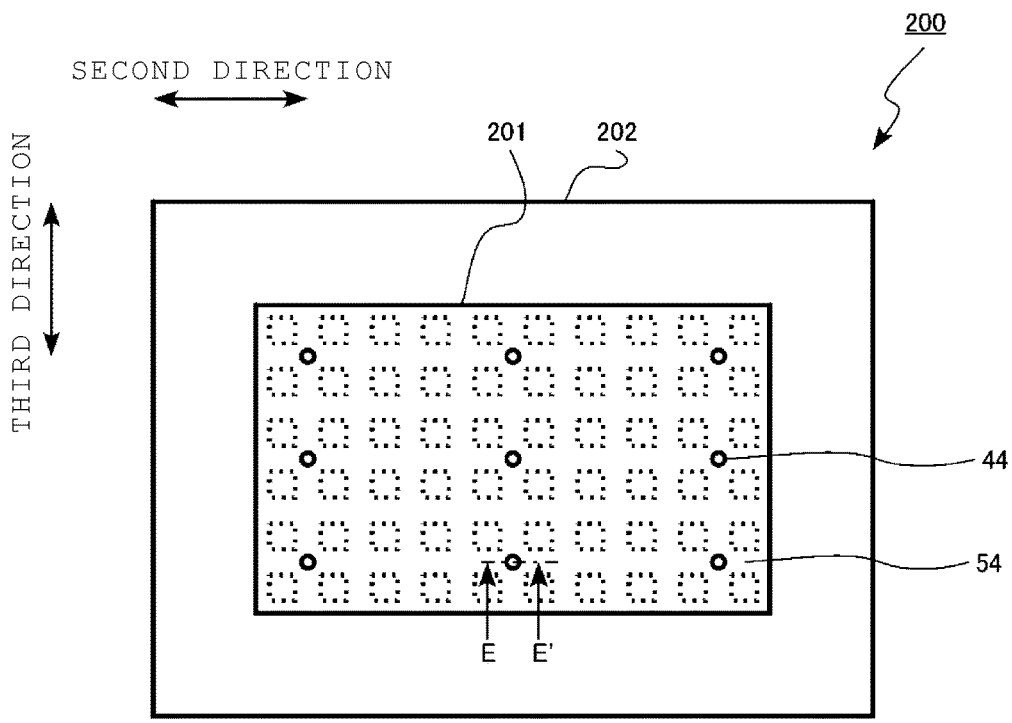
FIG. 17 is a layout diagram illustrating the semiconductor memory device according to the second embodiment.

FIG. 16 is a schematic cross-sectional view illustrating the semiconductor memory device according to the second embodiment. FIG. 17 is a layout diagram illustrating the semiconductor memory device according to the second embodiment. FIG. 16 illustrates an EE' cross-section of FIG. 17. FIG. 16 illustrates an arrangement pattern of the second barrier insulating layer and the first cavity.

FIG. 16 is a diagram corresponding to FIG. 1 of the first embodiment. FIG. 17 is a diagram corresponding to FIG. 4 of the first embodiment.

The semiconductor memory device according to the second embodiment is a DRAM 200. FIG. 17 is a layout diagram of the DRAM 200. FIG. 17 is an image illustrating a chip of the DRAM 200 when seen from the top.

As illustrated in FIG. 17, the DRAM 200 includes a memory cell array portion 201 and a peripheral circuit portion 202. The memory cell array portion 201 is surrounded by, for example, the peripheral circuit portion 202.

As illustrated in FIG. 16, the memory cell array portion 201 includes a memory cell array 201a and a wiring region 201b on the memory cell array 201a. In FIG. 16, a portion surrounded by a broken line is one memory cell MC.

As illustrated in FIG. 16, the memory cell array portion 201 includes the silicon substrate 30, the substrate insulating layer 32, the inter-cell insulating layer 34, the cell array upper insulating layer 36, the first barrier insulating layer 38, the interlayer insulating layer 40, the protective insulating layer 42, the second barrier insulating layer 44, the cap insulating layer 46, the first metal wiring layer 48, the second metal wiring layer 50, the third cavity 52, a first cavity 54, the plate line PL, the plurality of word lines WL, and the plurality of bit lines BL.

The silicon substrate 30 is an example of the semiconductor layer. The inter-cell insulating layer 34 is an example of the sixth insulating layer. The cell array upper insulating layer 36 is an example of the fifth insulating layer. The first barrier insulating layer 38 is an example of the fourth insulating layer. The protective insulating layer 42 is an example of the first insulating layer. The second barrier insulating layer 44 is an example of the second insulating layer. The cap insulating layer 46 is an example of the third insulating layer. The first metal wiring layer 48 is an example of the first wiring layer. The second metal wiring layer 50 is an example of the third wiring layer. The bit line BL is an example of the second wiring layer.

As illustrated in FIG. 16, the cell array upper insulating layer 36 has the first cavity 54. As indicated by a dotted line in FIG. 17, the first cavity 54 is located, for example, in a lattice shape in the memory cell array portion 201.

As illustrated in FIG. 16, for example, the second barrier insulating layer 44 is provided on the first cavity 54. For example, the second barrier insulating layer 44 is provided between the first cavity 54 and the cap insulating layer 46. For example, the first cavity 54 and the third cavity 52 are connected to each other.

Next, an example of a method of manufacturing the semiconductor memory device according to the second embodiment will be described. The method of manufacturing the semiconductor memory device according to the second embodiment is the same as the method of manufacturing the semiconductor memory device according to the first embodiment, except that the first cavity 54 is formed in the cell array upper insulating layer 36.

Figure 18:
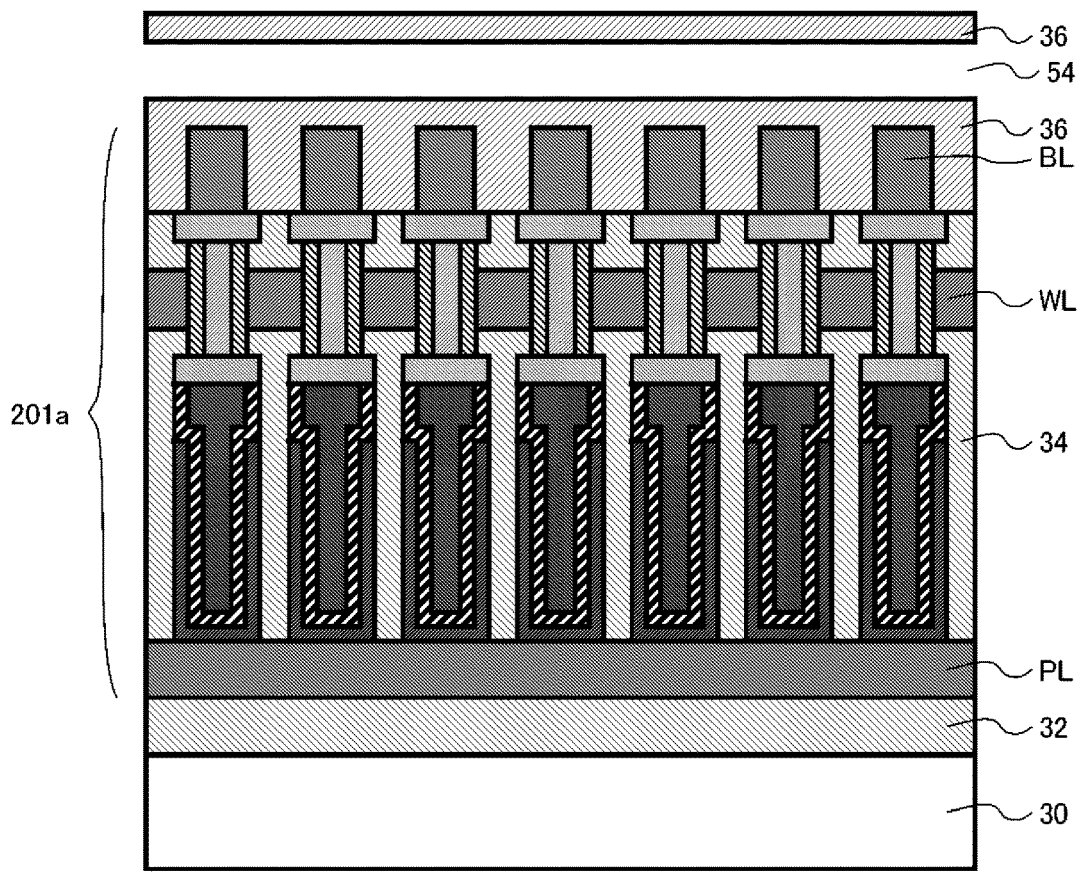
FIG. 18 is a schematic cross-sectional view illustrating an example of a method of manufacturing the semiconductor memory device according to the second embodiment.
Figure 19:
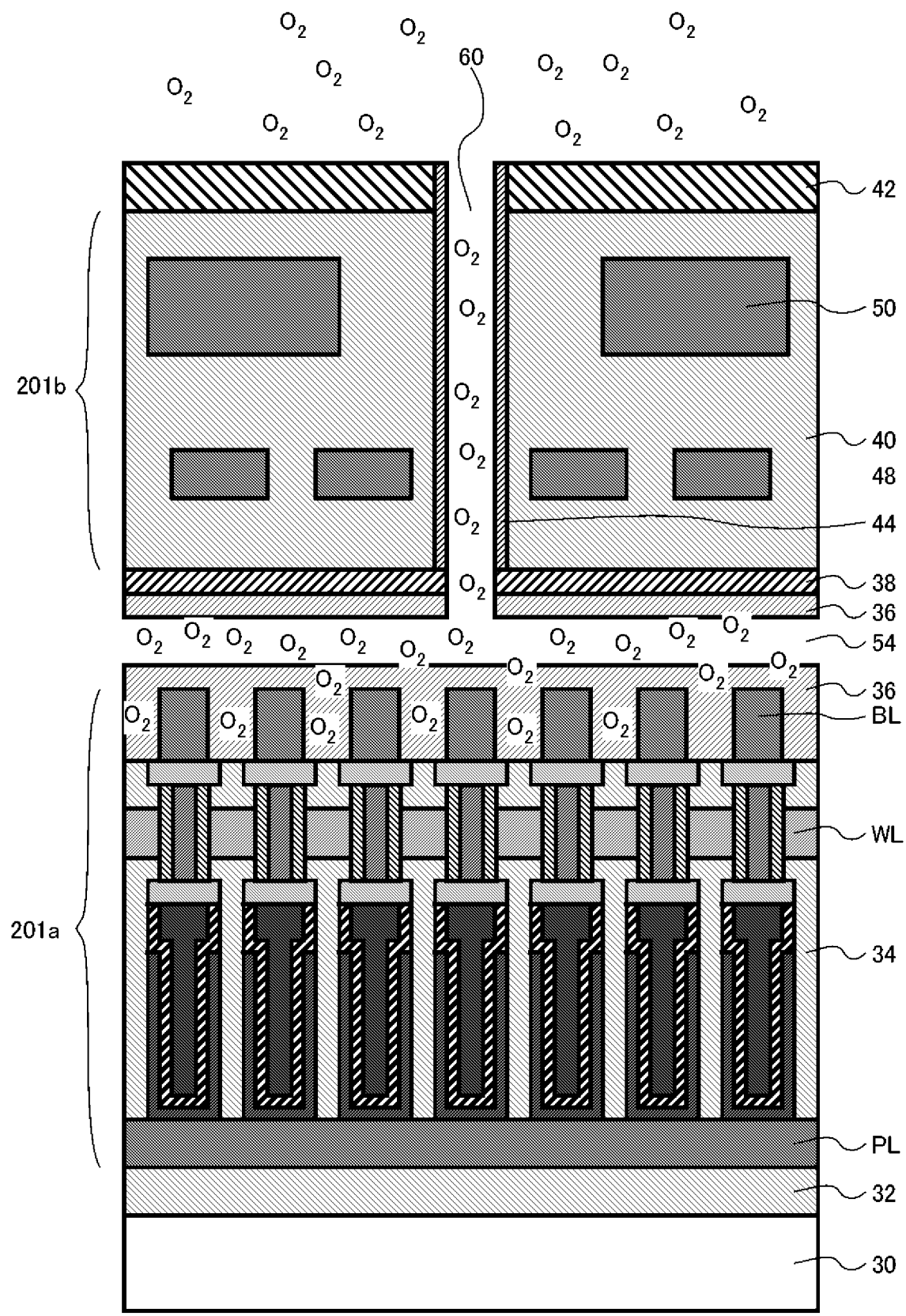
FIG. 19 is a schematic cross-sectional view illustrating the example of the method of manufacturing the semiconductor memory device according to the second embodiment.

FIGS. 18 and 19 are schematic cross-sectional views illustrating the example of the method of manufacturing the semiconductor memory device according to the second embodiment. FIGS. 18 and 19 illustrate a cross-section corresponding to FIG. 17. FIGS. 18 and 19 are diagrams illustrating the example of the method of manufacturing the memory cell array portion 201 of the DRAM 200.

First, using a well-known process technique, the substrate insulating layer 32 and the memory cell array 201a are formed on the silicon substrate 30. Next, the cell array upper insulating layer 36 having the first cavity 54 is formed (FIG. 18). The cell array upper insulating layer 36 is, for example, a silicon oxide layer.

When the cell array upper insulating layer 36 is formed, for example, a first silicon oxide film is formed using the CVD method. Next, for example, a lattice-shaped groove is formed on the front surface of the first silicon oxide film using the lithography method and the RIE method. Next, a second silicon oxide film having lower step coverage is formed using the CVD method and covers only an upper portion of the lattice-shaped groove. A portion of the groove that is not embedded with the second silicon oxide film is the first cavity 54.

Next, the first barrier insulating layer 38, the wiring region 201b, and the protective insulating layer 42 are formed on the cell array upper insulating layer 36.

Next, an opening 60 that penetrates the protective insulating layer 42 and interlayer insulating layer 40 from the front surface of the protective insulating layer 42 and reaches the first barrier insulating layer 38 is formed.

Next, the second barrier insulating layer 44 is formed on a side wall of the opening 60. Next, the first barrier insulating layer 38 that is exposed from the bottom surface of the opening 60 and the cell array upper insulating layer 36 that is positioned below the first barrier insulating layer 38 are removed to expose the first cavity 54 from the bottom of the opening 60.

Next, a heat treatment is performed in an atmosphere containing oxygen (O) (FIG. 19). The heat treatment is performed in an atmosphere containing oxygen gas ($O_2$). For example, oxygen is supplied to the memory cell array 201a through the opening 60 and the first cavity 54.

Next, the cap insulating layer 46 is formed using the same method as the manufacturing method according to the first embodiment.

With the above-described manufacturing method, the memory cell array portion 201 of the DRAM 200 illustrated in FIG. 16 is manufactured.

In the DRAM 200 according to the second embodiment, the cell array upper insulating layer 36 has the first cavity 54. As a result, the supply of oxygen from the opening 60 to the memory cell array 201a can be further accelerated as compared to the DRAM 100 according to the first embodiment. Accordingly, the recovery of the characteristic deterioration of the oxide semiconductor transistor TR can be accelerated.

In addition, the supply of oxygen from the opening 60 to the memory cell array 201a can be accelerated. Therefore, for example, as illustrated in FIG. 17, the number of second barrier insulating layers 44 in the memory cell array portion 201 can be reduced as compared to the memory cell array portion 101 according to the first embodiment illustrated in FIG. 4. In other words, for example, the number of openings 60 formed in the interlayer insulating layer 40 can be reduced.

Modification Example

A semiconductor memory device according to a modification example of the second embodiment is different from the semiconductor memory device according to the second embodiment, in that the first cavity and the third cavity are not connected to each other.

Figure 20:
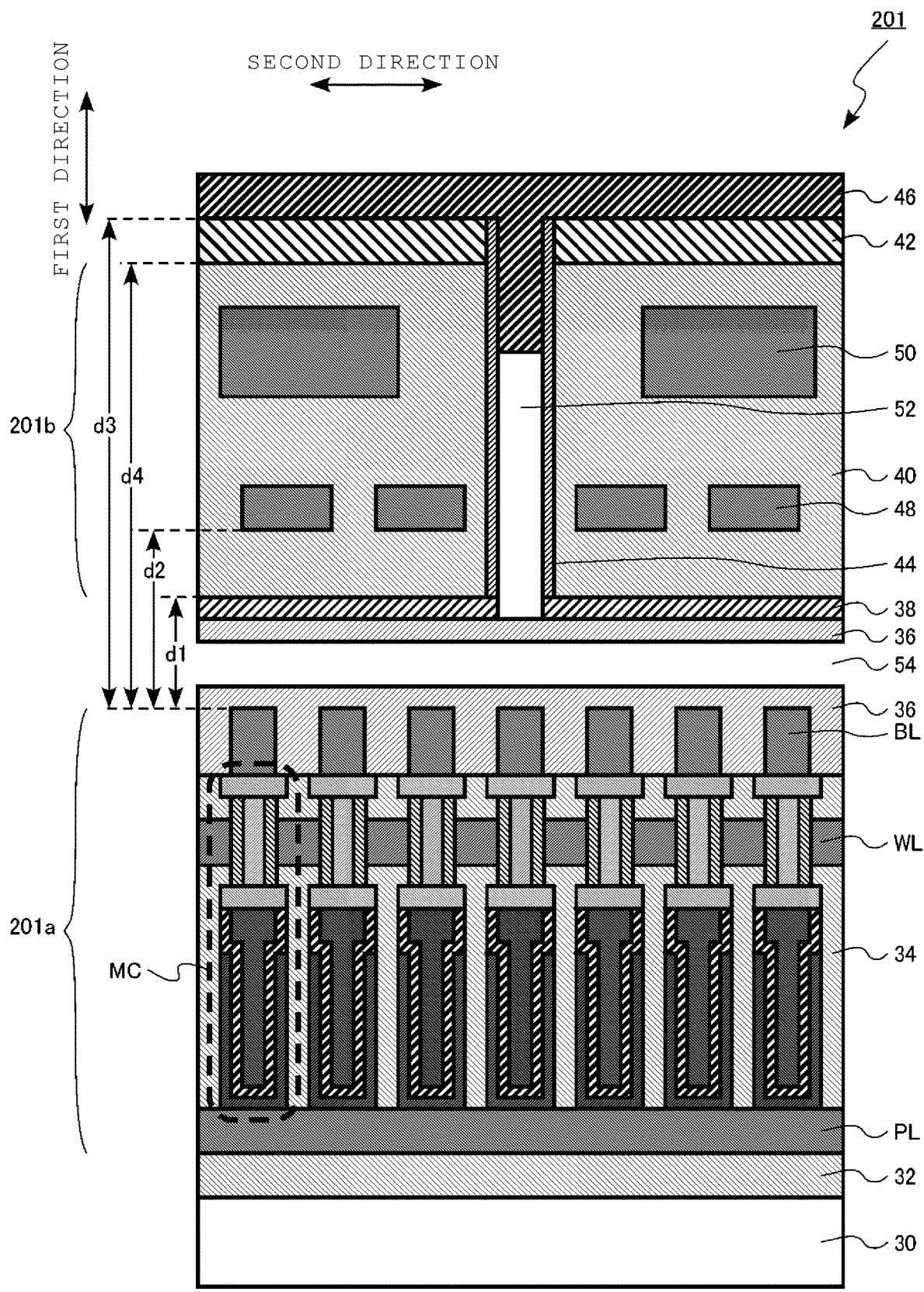
FIG. 20 is a schematic cross-sectional view illustrating a semiconductor memory device according to a modification example of the second embodiment.

FIG. 20 is a schematic cross-sectional view illustrating the semiconductor memory device according to the modification example of the second embodiment. FIG. 20 is a diagram corresponding to FIG. 16 of the second embodiment.

In the semiconductor memory device according to the modification example of the second embodiment, the first cavity 54 and the third cavity 52 are not connected to each other. In other words, a part of the cell array upper insulating layer 36 is provided between the first cavity 54 and the third cavity 52.

As described above, with the second embodiment and the modification example, characteristic deterioration during the manufacturing of the oxide semiconductor transistor can be recovered, and the DRAM 100 having excellent characteristics can be implemented.

Third Embodiment

A semiconductor memory device according to a third embodiment is different from the semiconductor memory device according to the second embodiment, in that at least a part of the first cavity is provided between the second wiring layers adjacent to each other. Hereinafter, the description of a part of the same contents as those of the first embodiment and the second embodiment will not be repeated.

Figure 21:
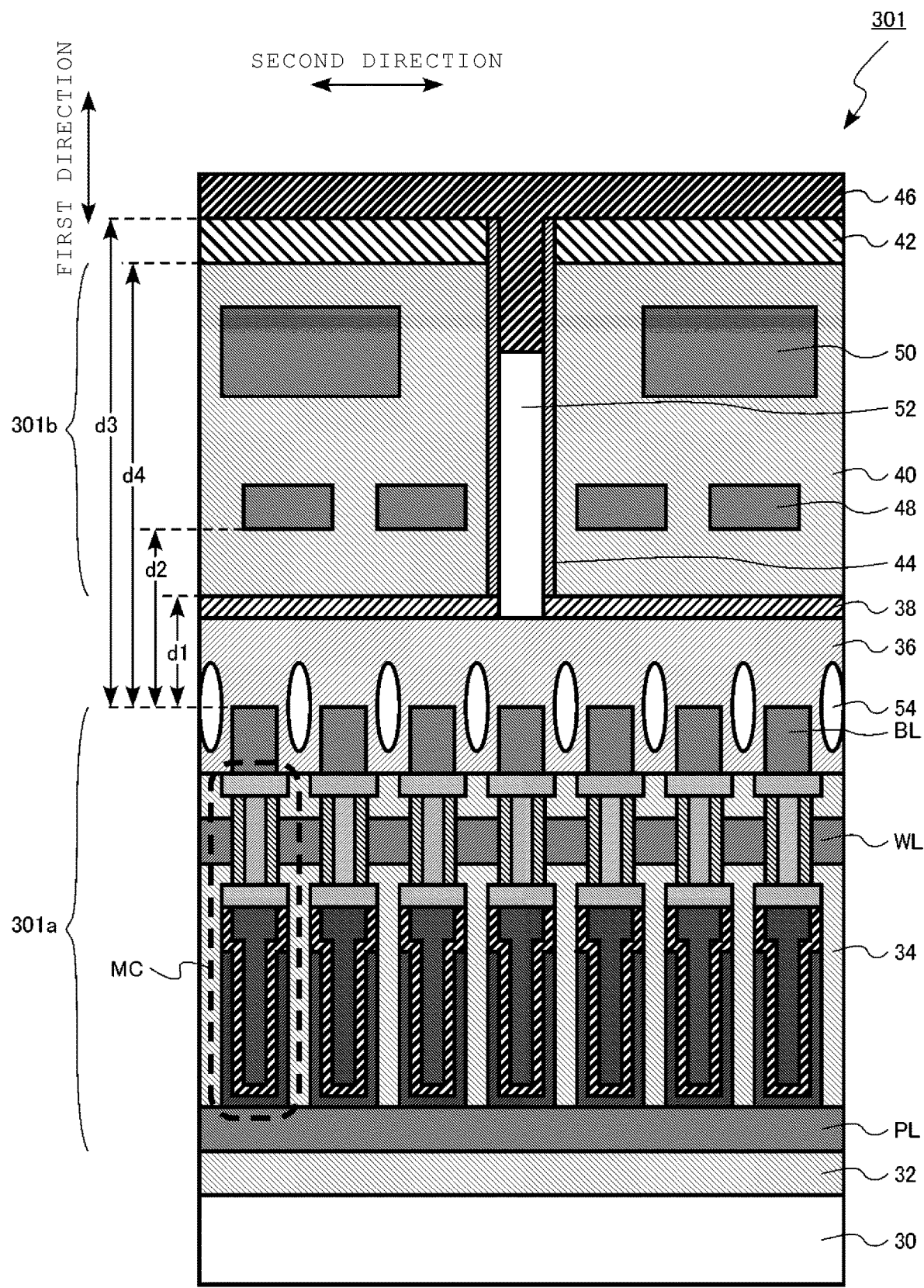
FIG. 21 is a schematic cross-sectional view illustrating a semiconductor memory device according to a third embodiment.

FIG. 21 is a schematic cross-sectional view illustrating the semiconductor memory device according to the third embodiment. FIG. 21 is a diagram corresponding to FIG. 16 of the second embodiment.

The semiconductor memory device according to the third embodiment is a DRAM 300. As illustrated in FIG. 21, the memory cell array portion 301 of the DRAM 300 includes a memory cell array 301a and a wiring region 301b on the memory cell array 301a. In FIG. 21, a portion surrounded by a broken line is one memory cell MC.

As illustrated in FIG. 21, the memory cell array portion 301 includes the silicon substrate 30, the substrate insulating layer 32, the inter-cell insulating layer 34, the cell array upper insulating layer 36, the first barrier insulating layer 38, the interlayer insulating layer 40, the protective insulating layer 42, the second barrier insulating layer 44, the cap insulating layer 46, the first metal wiring layer 48, the second metal wiring layer 50, the third cavity 52, the first cavity 54, the plate line PL, the plurality of word lines WL, and the plurality of bit lines BL.

The silicon substrate 30 is an example of the semiconductor layer. The inter-cell insulating layer 34 is an example of the sixth insulating layer. The cell array upper insulating layer 36 is an example of the fifth insulating layer. The first barrier insulating layer 38 is an example of the fourth insulating layer. The protective insulating layer 42 is an example of the first insulating layer. The second barrier insulating layer 44 is an example of the second insulating layer. The cap insulating layer 46 is an example of the third insulating layer. The first metal wiring layer 48 is an example of the first wiring layer. The second metal wiring layer 50 is an example of the third wiring layer. The bit line BL is an example of the second wiring layer.

As illustrated in FIG. 21, the cell array upper insulating layer 36 has the first cavity 54. At least a part of the first cavity 54 is provided between the bit lines BL adjacent to each other. The first cavity 54 extends along the bit line BL in a third direction perpendicular to the first direction and the second direction.

FIG. 21 illustrates a case where the first cavity 54 and the third cavity 52 are not connected to each other. For example, the first cavity 54 and the third cavity 52 may be connected to each other.

For example, when the cell array upper insulating layer 36 is formed on the bit line BL, by forming a film having lower step coverage using the CVD method, the first cavity 54 can be formed between the bit lines BL adjacent to each other.

In the DRAM 300 according to the third embodiment, the cell array upper insulating layer 36 has the first cavity 54 provided between the bit lines BL adjacent to each other. As a result, the supply of oxygen from the opening 60 to the memory cell array 201a can be further accelerated as compared to the DRAM 100 according to the first embodiment. Accordingly, the recovery of the characteristic deterioration of the oxide semiconductor transistor TR can be accelerated.

As described above, with the third embodiment, characteristic deterioration during the manufacturing of the oxide semiconductor transistor can be recovered, and the DRAM having excellent characteristics can be implemented.

Fourth Embodiment

A semiconductor memory device according to a fourth embodiment is different from the semiconductor memory device according to the first embodiment, in that the memory cell array includes a first portion and a second portion provided in a second direction perpendicular to the first direction with respect to the first portion, and a sixth insulating layer is provided between the first portion and the second portion and has a second cavity. Hereinafter, the description of a part of the same contents as those of the first embodiment will not be repeated.

Figure 22:
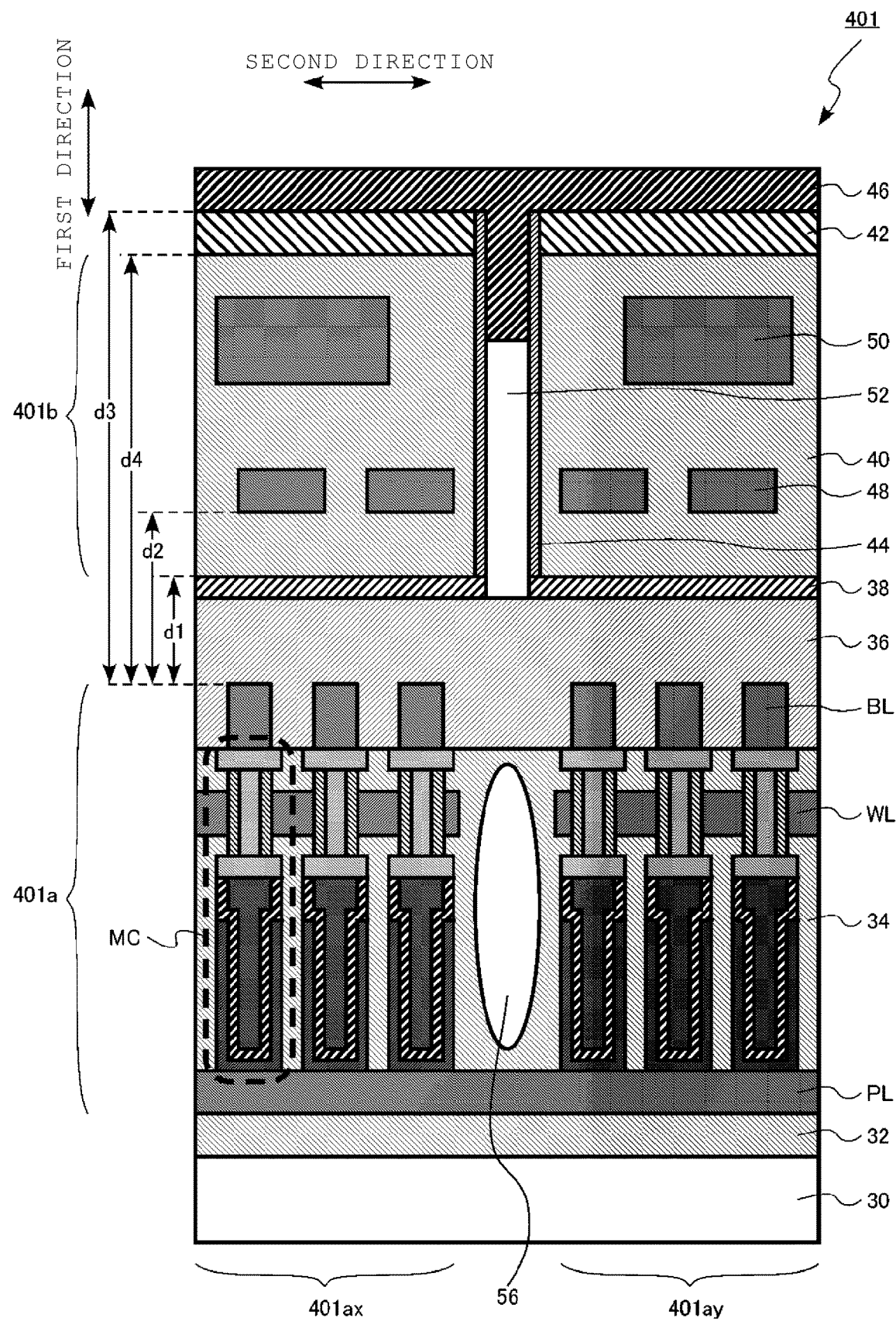
FIG. 22 is a schematic cross-sectional view illustrating a semiconductor memory device according to a fourth embodiment.

FIG. 22 is a schematic cross-sectional view illustrating the semiconductor memory device according to the fourth embodiment. FIG. 22 is a diagram corresponding to FIG. 1 of the first embodiment.

The semiconductor memory device according to the fourth embodiment is a DRAM 400. As illustrated in FIG. 22, the memory cell array portion 401 of the DRAM 400 includes a memory cell array 401a and a wiring region 401b on the memory cell array 401a. In FIG. 22, a portion surrounded by a broken line is one memory cell MC.

The memory cell array 401a includes a first portion 401ax and a second portion 401ay. The memory cell array 401a is divided into the first portion 401ax and the second portion 401ay. The second portion 401ay is provided in the second direction perpendicular to the first direction with respect to the first portion 401ax.

As illustrated in FIG. 22, the memory cell array portion 301 includes the silicon substrate 30, the substrate insulating layer 32, the inter-cell insulating layer 34, the cell array upper insulating layer 36, the first barrier insulating layer 38, the interlayer insulating layer 40, the protective insulating layer 42, the second barrier insulating layer 44, the cap insulating layer 46, the first metal wiring layer 48, the second metal wiring layer 50, the third cavity 52, a second cavity 56, the plate line PL, the plurality of word lines WL, and the plurality of bit lines BL.

The silicon substrate 30 is an example of the semiconductor layer. The inter-cell insulating layer 34 is an example of the sixth insulating layer. The cell array upper insulating layer 36 is an example of the fifth insulating layer. The first barrier insulating layer 38 is an example of the fourth insulating layer. The protective insulating layer 42 is an example of the first insulating layer. The second barrier insulating layer 44 is an example of the second insulating layer. The cap insulating layer 46 is an example of the third insulating layer. The first metal wiring layer 48 is an example of the first wiring layer. The second metal wiring layer 50 is an example of the third wiring layer. The bit line BL is an example of the second wiring layer.

As illustrated in FIG. 22, the second cavity 56 is provided in the inter-cell insulating layer 34 between the first portion 401ax and the second portion 401ay. The second cavity 56 extends, for example, along the bit line BL in the third direction perpendicular to the first direction and the second direction.

For example, the second barrier insulating layer 44 is provided on the second cavity 56. For example, the second barrier insulating layer 44 is provided between the second cavity 56 and the cap insulating layer 46. For example, the first cavity 54 and the second cavity 56 may be connected to each other.

In the DRAM 400 according to the fourth embodiment, the second cavity 56 is provided between the first portion 401ax and the second portion 401ay of the memory cell array 401a. As a result, the supply of oxygen from the opening 60 to the memory cell array 401a can be further accelerated as compared to the DRAM 100 according to the first embodiment. Accordingly, the recovery of the characteristic deterioration of the oxide semiconductor transistor TR can be accelerated.

As described above, with the fourth embodiment, characteristic deterioration during the manufacturing of the oxide semiconductor transistor can be recovered, and the DRAM having excellent characteristics can be implemented.

In the first to fourth embodiments, the example where the capacitor CA is provided below the oxide semiconductor transistor TR is described. However, the capacitor CA may be provided on the oxide semiconductor transistor TR.

In addition, in the first to fourth embodiments, the example where the memory cell MC includes the capacitor CA is described. However, for example, the memory cell MC may include only the transistor without including the capacitor CA.

In the first to fourth embodiments, the example where the memory cells MC are two-dimensionally located in the memory cell array is described. However, a structure where the memory cells MC are three-dimensionally located in the memory cell array may also be adopted.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
   a memory cell array including a plurality of memory cells, each of the memory cells including at least an oxide semiconductor transistor;
   a first insulating layer disposed above the memory cell array;
   a first wiring layer disposed between the memory cell array and the first insulating layer;
   a second insulating layer extending in a first direction from the memory cell array toward the first insulating layer, wherein
   a first distance in the first direction from a lower end of the second insulating layer to the memory cell array is less than a second distance in the first direction from the first wiring layer to the memory cell array,
   a third distance in the first direction from an upper end of the second insulating layer to the memory cell array is greater than a fourth distance in the first direction from the first insulating layer to the memory cell array, and
   the second insulating layer has an annular cross-section; and
   a third insulating layer further disposed over the first insulating layer, a portion of the third insulating layer being surrounded by the second insulating layer.

2. The semiconductor memory device according to claim 1,
   wherein the second insulating layer includes at least one insulation material selected from the group consisting of aluminum oxide, yttrium oxide, zirconium oxide, lanthanum oxide, hafnium oxide, tantalum oxide, silicon nitride, aluminum nitride, silicon oxynitride, aluminum oxynitride, and nitrogen-doped silicon carbide.

3. The semiconductor memory device according to claim 1,
   wherein the third insulating layer includes silicon nitride.

4. The semiconductor memory device according to claim 1,
   wherein the first insulating layer includes silicon nitride.

5. The semiconductor memory device according to claim 1, further comprising a fourth insulating layer provided between the memory cell array and the first wiring layer, the fourth insulating layer being in contact with the lower end of the second insulating layer.

6. The semiconductor memory device according to claim 5,
   wherein the fourth insulating layer includes at least one insulation material selected from the group consisting of aluminum oxide, yttrium oxide, zirconium oxide, lanthanum oxide, hafnium oxide, tantalum oxide, silicon nitride, aluminum nitride, silicon oxynitride, aluminum oxynitride, and nitrogen-doped silicon carbide.

7. The semiconductor memory device according to claim 5, further comprising a fifth insulating layer provided between the memory cell array and the fourth insulating layer and having a first cavity.

8. The semiconductor memory device according to claim 7,
   wherein the fifth insulating layer includes silicon oxide.

9. The semiconductor memory device according to claim 7,
   wherein the second insulating layer is provided between the first cavity and the third insulating layer.

10. The semiconductor memory device according to claim 7,
    wherein the memory cell array further includes a plurality of second wiring layers provided between the plurality of memory cells and the fourth insulating layer, and at least a portion of the first cavity is provided between adjacent ones of the second wiring layers.

11. The semiconductor memory device according to claim 1, wherein the memory cell array includes a first portion and a second portion provided in a second direction perpendicular to the first direction, and the semiconductor memory device further comprises a sixth insulating layer provided between the first portion and the second portion and having a second cavity.

12. The semiconductor memory device according to claim 11, wherein the second insulating layer is provided between the second cavity and the third insulating layer.

13. The semiconductor memory device according to claim 1, further comprising a third cavity surrounded by the second insulating layer.

14. The semiconductor memory device according to claim 1, further comprising a third wiring layer provided between the first wiring layer and the first insulating layer.

15. The semiconductor memory device according to claim 1, wherein the first wiring layer includes copper (Cu) or aluminum (Al).

16. The semiconductor memory device according to claim 1, further comprising a semiconductor layer provided such that the memory cell array is provided between the first insulating layer and the semiconductor layer.

17. The semiconductor memory device according to claim 1, wherein the oxide semiconductor transistor includes an oxide semiconductor layer containing at least one element selected from the group consisting of indium (In), gallium (Ga), silicon (Si), aluminum (Al), and tin (Sn), zinc (Zn), and oxygen (O).

18. The semiconductor memory device according to claim 1, wherein the plurality of memory cells further include a capacitor.

* * * * *